US008779471B2

(12) United States Patent  (10) Patent No.: US 8,779,471 B2
Hata et al.  (45) Date of Patent: Jul. 15, 2014

(54) FIELD-EFFECT TRANSISTOR, SEMICONDUCTOR WAFER, METHOD FOR PRODUCING FIELD-EFFECT TRANSISTOR AND METHOD FOR PRODUCING SEMICONDUCTOR WAFER

(75) Inventors: Masahiko Hata, Ibaraki (JP); Hisashi Yamada, Phoenix, AZ (US); Noboru Fukuhara, Ibaraki (JP); Shinichi Takagi, Tokyo (JP); Mitsuru Takenaka, Tokyo (JP); Masafumi Yokoyama, Tokyo (JP); Tetsuji Yasuda, Ibaraki (JP); Yuji Urabe, Ibaraki (JP); Noriyuki Miyata, Ibaraki (JP); Taro Itatani, Ibaraki (JP); Hiroyuki Ishii, Ibaraki (JP)

(73) Assignees: Sumitomo Chemical Company, Limited, Tokyo (JP); The University of Tokyo, Tokyo (JP); National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 13/413,216

(22) Filed: Mar. 6, 2012

(65) Prior Publication Data

US 2012/0228673 A1 Sep. 13, 2012

Related U.S. Application Data

(63) Continuation-in-part of application No. PCT/JP2010/005461, filed on Sep. 6, 2010.

(30) Foreign Application Priority Data

Sep. 7, 2009 (JP) ................................. 2009-205890

(51) Int. Cl.
*H01L 29/66* (2006.01)
(52) U.S. Cl.
USPC .................. 257/194; 257/192; 257/E29.246; 438/172
(58) Field of Classification Search
None
See application file for complete search history.

(56) References Cited

U.S. PATENT DOCUMENTS 6,770,902 B2 * 8/2004 Phillips ........................... 257/20
7,429,747 B2 * 9/2008 Hudait et al. ................... 257/14

(Continued)

FOREIGN PATENT DOCUMENTS

| JP | 60-223163 A | 11/1985 |
| JP | 08-088353 A | 4/1996 |
| JP | 2000-174261 A | 6/2000 |
| JP | 2008-147524 A | 6/2008 |

OTHER PUBLICATIONS

Karmalkar et al., "A Simple Yet Comprehensive Unified Physical Model of the 2-D Electron Gas in Delta-Doped and Uniformly Doped High Electron Mobility Transistors," IEEE Transactions on Electron Devices, Jan. 2000, vol. 47, No. 1, pp. 11-23.*

(Continued)

*Primary Examiner* — Matthew W Such
*Assistant Examiner* — Samuel Lair
(74) *Attorney, Agent, or Firm* — Sughrue Mion, PLLC

(57) ABSTRACT

Provided is a field-effect transistor including a gate insulating layer, a first semiconductor crystal layer in contact with the gate insulating layer, and a second semiconductor crystal layer lattice-matching or pseudo lattice-matching the first semiconductor crystal layer. Here, the gate insulating layer, the first semiconductor crystal layer, and the second semiconductor crystal layer are arranged in the order of the gate insulating layer, the first semiconductor crystal layer, and the second semiconductor crystal layer, the first semiconductor crystal layer is made of $In_{x1}Ga_{1-x1}As_{y1}P_{1-y1}$ ($0<x1\leq1$, $0\leq y1\leq1$), the second semiconductor crystal layer is made of $In_{x2}Ga_{1-x2}As_{y2}P_{1-y2}$ ($0\leq x2\leq1$, $0\leq y2\leq1$, $y2\neq y1$), and the electron affinity $E_{a1}$ of the first semiconductor crystal layer is lower than the electron affinity $E_{a2}$ of the second semiconductor crystal layer.

22 Claims, 21 Drawing Sheets

(56) References Cited

U.S. PATENT DOCUMENTS

| | | | | |
|---|---|---|---|---|
| 7,508,014 | B2* | 3/2009 | Tanimoto | 257/192 |
| 7,576,409 | B1* | 8/2009 | Chen et al. | 257/560 |
| 7,842,972 | B2* | 11/2010 | Nichols et al. | 257/192 |
| 7,892,902 | B1* | 2/2011 | Hudait et al. | 438/172 |
| 8,119,488 | B2* | 2/2012 | Hellings et al. | 438/287 |
| 8,288,798 | B2* | 10/2012 | Passlack | 257/200 |
| 8,324,661 | B2* | 12/2012 | Radosavljevic et al. | 257/192 |
| 8,368,052 | B2* | 2/2013 | Pillarisetty et al. | 257/24 |
| 8,441,037 | B2* | 5/2013 | Geka | 257/201 |
| 2004/0137673 | A1 | 7/2004 | Passlack et al. | |
| 2006/0157733 | A1* | 7/2006 | Lucovsky et al. | 257/192 |
| 2008/0142786 | A1* | 6/2008 | Datta et al. | 257/24 |
| 2008/0284022 | A1 | 11/2008 | Ehara | |
| 2009/0085063 | A1* | 4/2009 | Makiyama et al. | 257/192 |
| 2010/0155701 | A1* | 6/2010 | Radosavljevic et al. | 257/24 |

OTHER PUBLICATIONS

E.A. Martin et al., "Highly Stable Microwave Performance of InP/InGaAs HIGFET's", IEEE Transactions on Electron Devices, Aug. 1990, vol. 37, No. 8, pp. 1916 and 1917.*

Sze et al., "Physics of Semiconductor Devices", John Wiley & Sons, 2007, pp. 408-410, ISBN-13 978-0-471-14323-9.*

S. Arabasz, et al., "XPS study of surface chemistry of epiready GaAs(100) surface after $(NH_4)_2S_x$ passivation", Vacuum, vol. 80, 2006, pp. 888-893.

E.A. Martin, et al., "Highly Stable Microwave Performance of InP/InGaAs HIGFET's", IEEE Transactions on Electron Devices, vol. 37, No. 8, Aug. 1990, pp. 1916-1917.

Narayan Chandra Paul, et al., "Oxidation of InAlAs and Its Application to Gate Insulator of InAlAs/InGaAs Metal Oxide Semiconductor High Electron Mobility Transistor", Japanese Journal of Applied Physics, vol. 44, No. 3, 2005, pp. 1174-1180.

* cited by examiner

FIELD-EFFECT TRANSISTOR, SEMICONDUCTOR WAFER, METHOD FOR PRODUCING FIELD-EFFECT TRANSISTOR AND METHOD FOR PRODUCING SEMICONDUCTOR WAFER

CROSS REFERENCE TO RELATED APPLICATION

The contents of the following Japanese patent application and PCT patent application are incorporated herein by reference:
JP2009-205890 filed on Sep. 7, 2009, and
PCT/JP2010/005461 filed on Sep. 6, 2010.

BACKGROUND

1. Technical Field

The present invention relates to a field-effect transistor, a semiconductor wafer, a method for producing a field-effect transistor, and a method for producing a semiconductor wafer.

2. Related Art

A metal-insulator-semiconductor field-effect transistor (MISFET), which uses a compound semiconductor for its channel layer, is expected to serve as a switching device suitable for high-frequency and higher-power operation. The MISFET, however, encounters a problem where the carrier mobility may fall when an energy level is formed at the interface between the semiconductor and the insulator. Non-Patent Document 1 discloses that the energy level formed at the interface between the semiconductor and the insulator (herein referred to as "the interface state") can be effectively reduced by treating the surface of the compound semiconductor with sulfide.
Non-Patent Document 1: S. Arabasz, et al., Vac. Vol. 80 (2006), page 888

It is, however, desired to further reduce the interface state. It is also desired to improve the performance of the field-effect transistor by employing a technique of reducing the influence of the interface state even if the interface state exists. An object of the present invention is to provide a field-effect transistor having a high channel mobility while keeping the influence of the interface state low.

SUMMARY

For a solution to the above-mentioned problems, according to the first aspect related to the present invention, provided is one exemplary a field-effect transistor including a gate insulating layer, a first semiconductor crystal layer in contact with the gate insulating layer, and a second semiconductor crystal layer lattice-matching or pseudo lattice-matching the first semiconductor crystal layer. Here, the gate insulating layer, the first semiconductor crystal layer, and the second semiconductor crystal layer are arranged in the order of the gate insulating layer, the first semiconductor crystal layer, and the second semiconductor crystal layer, the first semiconductor crystal layer is made of $In_{x1}Ga_{1-x1}As_{y1}P_{1-y1}$ ($0<x1\leq1$, $0\leq y1\leq1$), the second semiconductor crystal layer is made of $In_{x2}Ga_{1-x2}As_{y2}P_{1-y2}$ ($0\leq x2\leq1$, $0\leq y2\leq1$, $y2\neq y1$), and the electron affinity $E_{a1}$ of the first semiconductor crystal layer is lower than the electron affinity $E_{a2}$ of the second semiconductor crystal layer.

The second semiconductor crystal layer is, for example, made of $In_{x2}Ga_{1-x2}As_{y2}P_{1-y2}$ ($0\leq x2\leq1$, $0\leq y2\leq1$, $y2>y1$). The As atom concentration of the first semiconductor crystal layer is 1% or lower, for example. The field-effect transistor preferably further includes a third semiconductor crystal layer lattice-matching or pseudo lattice-matching the second semiconductor crystal layer. Here, the third semiconductor crystal layer is positioned between the first semiconductor crystal layer and the second semiconductor crystal layer, the third semiconductor crystal layer is, for example, made of $Al_{x3}In_{x4}Ga_{1-x3-x4}As_{y3}P_{1-y3}$ ($0<x3<1$, $0\leq x4<1$, $0<x3+x4<1$, $0\leq y3\leq1$), and the electron affinity $E_{a3}$ of the third semiconductor crystal layer is lower than the electron affinity $E_{a2}$ of the second semiconductor crystal layer.

The field-effect transistor may further include a gate electrode in contact with the gate insulating layer, and it is preferable that the gate electrode, the gate insulating layer, and the first semiconductor crystal layer be arranged in the order of the gate electrode, the gate insulating layer, and the first semiconductor crystal layer, and the gate insulating layer and the first semiconductor crystal layer satisfy the relation represented by $(\in_1 \cdot d_0)/(\in_0 \cdot d_1) > V/\delta$, where $d_0$ and $\in_0$ respectively denote the thickness and the specific dielectric constant of the gate insulating layer situated in an under-gate region sandwiched between the gate electrode and the second semiconductor crystal layer, $d_1$ and $\in_1$ respectively denote the thickness and the specific dielectric constant of the first semiconductor crystal layer situated in the under-gate region, V denotes the voltage that is applied to the gate electrode and is equal to or higher than the threshold voltage of the field-effect transistor, and $\delta = E_{a2} - E_{a1}$.

In the field-effect transistor, at least part of the second semiconductor crystal layer preferably contains an impurity that exhibits P-type conductivity. The second semiconductor crystal layer may be, for example, a crystal layer that is in contact with the first semiconductor crystal layer and contains an impurity that exhibits P-type conductivity. The second semiconductor crystal layer may include, for example, a non-doped layer that is in contact with the first semiconductor crystal layer and free from impurities and a doped layer that is in contact with the non-doped layer and contains said impurity that exhibits P-type conductivity. Furthermore, the doped layer may be constituted by a plurality of layers differing from each other in terms of the concentration of the impurity that exhibits P-type conductivity. The non-doped layer has a thickness of 20 nm or less, for example.

The field-effect transistor preferably further includes a fourth semiconductor crystal layer whose electron affinity $E_{a4}$ is lower than the electron affinity $E_{a2}$ of the second semiconductor crystal layer, it is preferable that the gate insulating layer, the second semiconductor crystal layer, and the fourth semiconductor crystal layer be arranged in the order of the gate insulating layer, the second semiconductor crystal layer, and the fourth semiconductor crystal layer, and the fourth semiconductor crystal layer lattice-match or pseudo lattice-match the second semiconductor crystal layer, the electron affinity $E_{a4}$ of the fourth semiconductor crystal layer is preferably lower than the electron affinity $E_{a2}$ of the second semiconductor crystal layer, and the fourth semiconductor crystal layer preferably contains an impurity that exhibits P-type conductivity.

The field-effect transistor may further include as gate electrode in contact with the gate insulating layer, a source electrode, and a drain electrode, and it is preferable that the gate electrode, the gate insulating layer, and the first semiconductor crystal layer be arranged in the order of the gate electrode, the gate insulating layer, and the first semiconductor crystal layer in a first direction, the gate electrode, the source electrode, and the drain electrode be arranged in the order of the source electrode, the gate electrode, and the drain electrode in a second direction perpendicular to the first direction, the first semiconductor crystal layer be formed in an under-gate region adjacent to the gate electrode in the first direction, the first semiconductor crystal layer be not formed between the source electrode and the under-gate region, or between the under-gate region and an under-source region adjacent to the source electrode in the first direction, and the first semiconductor crystal layer be not formed between the drain electrode and the under-gate region, or between the under-gate region and an under-drain region adjacent to the drain electrode in the first direction.

The field-effect transistor preferably further include a base wafer supporting a stack structure including the gate insulating layer, the first semiconductor crystal layer, and the second semiconductor crystal layer, and the base wafer is, for example, a wafer selected from the group consisting of a wafer made of single-crystal GaAs, a wafer made of single-crystal InP, a wafer made of single-crystal Si and a silicon-on-insulator (SOI) wafer.

The field-effect transistor preferably further include a gate electrode in contact with the gate insulating layer, a source electrode, and a drain electrode, the gate electrode, the gate insulating layer, the first semiconductor crystal layer, and the second semiconductor crystal layer may be arranged in the order of the gate electrode, the gate insulating layer, the first semiconductor crystal layer, and the second semiconductor crystal layer in a first direction, the gate electrode, the source electrode, and the drain electrode may be arranged in the order of the source electrode, the gate electrode, and the drain electrode in a second direction perpendicular to the first direction, the first semiconductor crystal layer and the second semiconductor crystal layer may be formed in an under-gate region adjacent to the gate electrode in the first direction, the second semiconductor crystal layer may be formed in an under-source region adjacent to the source electrode in the first direction and in an under-drain region adjacent to the drain electrode in the first direction, the second semiconductor crystal layer situated between the under-source region and the under-gate region and the second semiconductor crystal layer situated between the under-drain region and the under-gate region may be doped with an impurity atom that is to generate a carrier, and neither the first semiconductor crystal layer situated between the under-gate region and the source electrode or the under-source region nor the first semiconductor crystal layer situated between the under-gate region and the drain electrode or the under-drain region may be doped with said impurity atom that is to generate said carrier.

According to the second aspect related to the present invention, provided is one exemplary a semiconductor wafer including a base wafer, as second semiconductor crystal layer disposed directly or indirectly on the base wafer, and a first semiconductor crystal layer lattice-matching or pseudo lattice-matching the second semiconductor crystal layer. Here, the first semiconductor crystal layer is made of $In_{x1}Ga_{1-x1}As_{y1}P_{1-y1}$ ($0<x1\le1, 0\le y1\le1$), the second semiconductor crystal layer is made of $In_{x2}Ga_{1-x2}As_{y2}P_{1-y2}$ ($0\le x2\le1, 0\le y2\le1, y2\ne y1$), and the electron affinity $E_{a1}$ of the first semiconductor crystal layer is lower than the electron affinity $E_{a2}$ of the second semiconductor crystal layer. The base wafer supports a stack structure including the first semiconductor crystal layer and the second semiconductor crystal layer.

The second semiconductor crystal layer is, for example, made of $In_{x2}Ga_{1-x2}As_{y2}P_{1-y2}$ ($0\le x2\le1, 0\le y2\le1, y2>y1$). The As atom concentration of the first semiconductor crystal layer is 1% or lower. The semiconductor wafer preferably further include a third semiconductor crystal layer lattice-matching or pseudo lattice-matching the second semiconductor crystal layer, the third semiconductor crystal layer is positioned between the first semiconductor crystal layer and the second semiconductor crystal layer, the third semiconductor crystal layer is, for example, made of $Al_{x3}In_{x4}Ga_{1-x3-x4}As_{y3}P_{1-y3}$ ($0<x3<1, 0\le x4<1, 0<x3+x4<1, 0\le y3\le1$), and the electron affinity $E_{a3}$ of the third semiconductor crystal layer is preferably lower than the electron affinity $E_{a2}$ of the second semiconductor crystal layer.

In the semiconductor wafer, at least part of the second semiconductor crystal layer preferably contains an impurity that exhibits P-type conductivity. The second semiconductor crystal layer may be, for example, a crystal layer that is in contact with the first semiconductor crystal layer and contains an impurity that exhibits P-type conductivity. Furthermore, the second semiconductor crystal layer may include, for example, a non-doped layer that is in contact with the first semiconductor crystal layer and free from the impurity, and a doped layer that is in contact with the non-doped layer and contains said impurity. Furthermore, the doped layer may be constituted by a plurality of layers differing from each other in terms of the concentration of the impurity that exhibits P-type conductivity. The non-doped layer has a thickness of 20 nm or less, for example.

The semiconductor wafer preferably further include a fourth semiconductor crystal layer whose electron affinity $E_{a1}$ is lower than the electron affinity $E_{a2}$ of the second semiconductor crystal layer, it is preferable that the first semiconductor crystal layer, the second semiconductor crystal layer, and the fourth semiconductor crystal layer be arranged in the order of the first semiconductor crystal layer, the second semiconductor crystal layer, and the fourth semiconductor crystal layer, the fourth semiconductor crystal layer lattice-match or pseudo lattice-match the second semiconductor crystal layer, the electron affinity $E_{a4}$ of the fourth semiconductor crystal layer is preferably lower than the electron affinity $E_{a2}$ of the second semiconductor crystal layer, and the fourth semiconductor crystal layer preferably contains an impurity that exhibits P-type conductivity.

The base wafer in the semiconductor wafer is, for example, a wafer selected from the group consisting of a wafer made or single-crystal GaAs, a wafer made of single-crystal InP, a wafer made of single-crystal Si and a silicon-on-insulator (SOI) wafer.

According to the third aspect related to the present invention, provided is one exemplary method for producing a semiconductor wafer, including epitaxially growing a second semiconductor crystal layer on a base wafer, and epitaxially growing a first semiconductor crystal layer on the second semiconductor crystal layer. Here, during the epitaxial growth of the second semiconductor crystal layer, the second semiconductor crystal layer is grown as $In_{x2}Ga_{1-x2}As_{y2}P_{1-y2}$ ($0\le x2\le1, 0\le y2\le1$), during the epitaxial growth of the first semiconductor crystal layer, the first semiconductor crystal layer is grown as $In_{x1}Ga_{1-x1}As_{y1}P_{1-y1}$ ($0<x1\le1, 0\le y1\le1, y1\ne y2$) so as to lattice-match or pseudo lattice-match the second semiconductor crystal layer, and the first semiconductor crystal layer and the second semiconductor crystal layer are grown in such a manner that the electron affinity $E_{a1}$ of the first semiconductor crystal layer becomes lower than the electron affinity $E_{a2}$ of the second semiconductor crystal layer.

According to the third aspect, provided is one exemplary method for producing a field-effect transistor, including forming an insulating layer in contact with the first semiconductor crystal layer of the semiconductor wafer, and forming an electrically conductive layer in contact with the insulating layer, where the electrically conductive layer is to serve as a gate electrode of the field-effect transistor. The insulating layer is preferably formed by an ALD or MOCVD method in an atmosphere containing a reducing material.

The method for producing a field-effect transistor may include, prior to the formation of the insulating layer, forming, directly or indirectly on the first semiconductor crystal layer, a mask covering a region in which the gate electrode is to be formed, removing the first semiconductor crystal layer except for the region covered with the mask, by etching using the mask as a block film, and doping a region of the second semiconductor crystal layer with an impurity atom by ion implantation using the mask as a block film, where the first semiconductor crystal layer has been removed from the region of the second semiconductor crystal layer.

According to the fourth aspect related to the present invention, provided is one exemplary method for producing a field-effect transistor, including forming an insulating layer in contact with the first semiconductor crystal layer of a semiconductor wafer, and forming an electrically conductive layer in contact with the insulating layer, where the electrically conductive layer is to serve as a gate electrode of the field-effect transistor. The semiconductor wafer includes a first semiconductor crystal layer, and a second semiconductor crystal layer lattice-matching or pseudo lattice-matching the first semiconductor crystal layer. Here, the first semiconductor crystal layer is made of $In_{x1}Ga_{1-x1}As_{y1}P_{1-y1}$ (0<x1≤1, 0≤y1≤1), the second semiconductor crystal layer is made of $In_{x2}Ga_{1-x2}As_{y2}P_{1-y2}$ (0≤x2≤1, 0≤y2≤1, y2≠y1), and the electron affinity $E_{a1}$ of the first semiconductor crystal layer is lower than the electron affinity $E_{a2}$ of the second semiconductor crystal layer. The insulating layer is, for example, formed by an ALD or MOCVD method in an atmosphere containing a reducing material.

DESCRIPTION OF EXEMPLARY EMBODIMENTS

Figure 1:
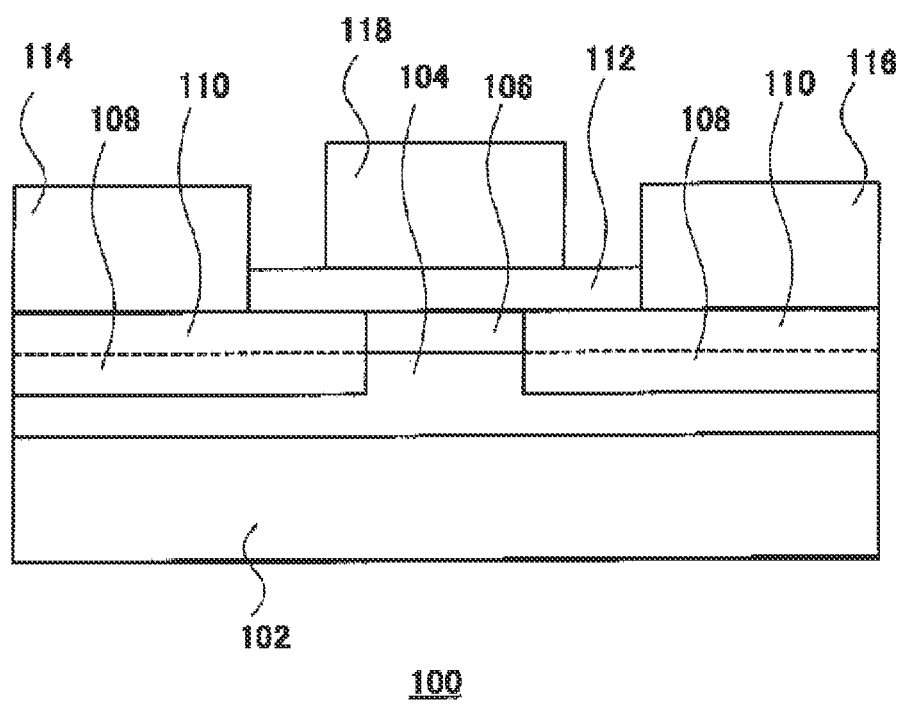
FIG. 1 illustrates an exemplary cross-section of a field-effect transistor 100.

FIG. 1 illustrates an exemplary cross-section of a field-effect transistor 100 relating to an embodiment of the present invention. The field-effect transistor 100 includes a base wafer 102, a second semiconductor crystal layer 104, a first semiconductor crystal layer 106, second N-type regions 108, first N-type regions 110, a gate insulating layer 112, a source electrode 114, a drain electrode 116, and a gate electrode 118.

The base wafer 102 supports a stack structure including the gate insulating layer 112, the first semiconductor crystal layer 106, and the second semiconductor crystal layer 104. Examples of the base wafer 102 include a wafer made of single-crystal GaAs, a wafer made of single-crystal InP, a wafer made of single-crystal Si and a silicon-on-insulator (SOI) wafer.

When a wafer made of single-crystal Si is used as the base wafer 102, the cost of the field-effect transistor 100 can be reduced by using a low-cost silicon wafer. Furthermore, when made of single-crystal Si, which has superior thermal conductivity, the base wafer 102 can efficiently release the heat generated by the field-effect transistor 100. An SOI wafer advantageously has superior thermal conductivity and low floating capacitance. Therefore, when an SOI wafer is used as the base wafer 102, the heat generated by the field-effect transistor 100 can be efficiently released and the operation speed of the field-effect transistor 100 can be increased due to the reduced floating capacitance of the field-effect transistor 100.

The second semiconductor crystal layer 104 lattice-matches or pseudo lattice-matches the first semiconductor crystal layer 106, and the first semiconductor crystal layer 106 is in contact with the gate insulating layer 112. The second semiconductor crystal layer 104 is, for example, made of $In_{x2}Ga_{1-x2}As_{y2}P_{1-y2}$ ($0 \leq x2 \leq 1$, $0 \leq y2 \leq 1$, $y2 \neq y1$). The first semiconductor crystal layer 106 is, for example, made of $In_{x1}Ga_{1-x1}As_{y1}P_{1-y1}$ ($0 < x1 \leq 1$, $0 \leq y1 \leq 1$). The electron affinity $E_{a1}$ of the first semiconductor crystal layer 106 is lower than the electron affinity $E_{a2}$ of the second semiconductor crystal layer 104.

Specifically speaking, when the first semiconductor crystal layer 106 is made of trip the second semiconductor crystal layer 104 is made of InGaAs, for example. When the first semiconductor crystal layer 106 is made of InGaP, the second semiconductor crystal layer 104 is made of InGaAs, for example. When the first semiconductor crystal layer 106 is made of InGaP, the second semiconductor crystal layer 104 is made of InP, for example.

A hetero interface is formed at the junction interface between the second semiconductor crystal layer 104 and the first semiconductor crystal layer 106, and an electron cloud is formed in the vicinity of the hetero interface. The electron cloud serves as the channel of the field-effect transistor 100. A large number of carrier trap centers resulting from crystal defects are formed at the interface between the gate insulating layer 112 and the first semiconductor crystal layer 106. The electron cloud is distant from the interface between the gate insulating layer 112 and the first semiconductor crystal layer 106 by a distance corresponding to the thickness of the first semiconductor crystal layer 106. This lowers the probability that the carriers moving through the channel of the field-effect transistor 100 are scattered by the trap centers. Therefore, the field-effect transistor 100 can achieve increased carrier mobility.

The second semiconductor crystal layer 104 is preferably made of $In_{x2}Ga_{1-x2}As_{y2}P_{1-y2}$ ($0 \leq y2 \leq 1$, $0 \leq y2 \leq 1$, $y2 > y1$). In other words, the first semiconductor crystal layer 106 preferably has a smaller ratio of As to P than the second semiconductor crystal layer 104. The inventors of the present invention have found, through experiments and following examination of their results, that As oxides serve as trap centers for carrier electrons. The number of the trap centers is reduced by lowering the ratio of the As in the first semiconductor crystal layer 106 that is in contact with the gate insulating layer 112. This resultantly lowers the ratio of scattered carriers. As a consequence, the carrier mobility can be increased.

When the ratio of the As in the first semiconductor crystal layer 106 is lowered, the ratio of the As is preferably lowered to such a level that the As atom concentration in the first semiconductor crystal layer 106 becomes equal to or falls below the measurable limits for measurement utilizing X-ray photoelectron spectroscopy. Generally speaking, the detectable limits of atoms for measurement utilizing X-ray photoelectron spectroscopy is approximately 1%. For example, the ratio of the As in the first semiconductor crystal layer 106 is preferably equal to or lower than 1%.

At least part of the second semiconductor crystal layer 104 preferably contains impurities that exhibit P-type conductivity. When at least part of the second semiconductor crystal layer 104 contains impurities that exhibit P-type conductivity, some of the electrons are trapped by the acceptors. Thus, the negative spatial charges increase in the second semiconductor crystal layer 104. This resultantly increases the potential of the second semiconductor crystal layer 104 and can prevent the electron cloud formed in the vicinity of the interface between the second semiconductor crystal layer 104 and the first semiconductor crystal layer 106 from diffusing into the second semiconductor crystal layer 104. Accordingly, the density of the electron cloud can be increased at the interface, and the controllability of the channel electrons by the gate electrode can be improved.

The second semiconductor crystal layer 104 may include a non-doped layer that is in contact with the first semiconductor crystal layer 106 and free from the impurities exhibiting P-type conductivity, and a doped layer that is in contact with the non-doped layer and contains the impurities exhibiting P-type conductivity. The doped layer may be made up by a plurality of layers that differ from each other in terms of the concentration of the impurities exhibiting P-type conductivity. For example, the non-doped layer is formed in a region within a predetermined distance from the interface between the second semiconductor crystal layer 104 and the first semiconductor crystal layer 106. Due to the fact that the second semiconductor crystal layer 104 includes the above-described non-doped and doped layers, the carriers are prevented from being scattered by the P-type impurities in the vicinity of the interface. Thus, the mobility can be prevented from falling. The non-doped layer has a thickness of 20 nm or less, for example, and preferably has a thickness of 10 nm or less.

The field-effect transistor 100 may have a fourth semiconductor crystal layer between the second semiconductor crystal layer 104 and the base wafer 102. The fourth semiconductor crystal layer may have an electron affinity equivalent to the electron affinity of the first semiconductor crystal layer 106. Due to the fact that the field-effect transistor 100 has the fourth semiconductor crystal layer, the electron cloud in the vicinity of the interface between the second semiconductor crystal layer 104 and the first semiconductor crystal layer 106 can be prevented from diffusing toward the base wafer. Accordingly, the density of the electron cloud can be increased and the controllability of the channel electrons by the gate electrode can be improved.

The second N-type regions 108 are N-type regions formed in the second semiconductor crystal layer 104. The first N-type regions 110 are N-type regions formed in the first semiconductor crystal layer 106. A method of forming an N-type region may involve introducing N-type impurities such as Si atoms by ion implantation and then activating the impurities by annealing. The N-type regions are formed under the source electrode 114 and the drain electrode 116. The second N-type region 108 and the first N-type region 110 under the source electrode 114 serve as the source of the field-effect transistor. The second N-type region 108 and the first N-type region 110 under the drain electrode 116 serve as the drain of the field-effect transistor.

The gate insulating layer 112 galvanically isolates the first semiconductor crystal layer 106 and the gate electrode 118 from each other. The gate insulating layer 112 is for example, an aluminum oxide ($Al_2O_3$) layer. A method of producing an aluminum oxide layer is an atomic layer deposition (ALD) method. The source electrode 114 and the drain electrode 116 are formed in contact with the first N-type regions 110. The gate electrode 118 is formed in contact with the gate insulating layer 112. The source electrode 114, the drain electrode 116, and the gate electrode 118 are, for example, a metal stack film made up by Ti and Au.

The gate electrode 118, the gate insulating layer 112, the first semiconductor crystal layer 106, and the second semiconductor crystal layer 104 are arranged. In an order of the gate electrode 118, the gate insulating layer 112, the first semiconductor crystal layer 106, and the second semiconductor crystal layer 104. The gate insulating layer 112 and the first semiconductor crystal layer 106 preferably have characteristics satisfying the relation expressed by Formula 1.

$$(\epsilon_1 \cdot d_0)/(\epsilon_0 \cdot d_1) > V/\delta \quad \text{(Formula 1)}$$

Here, $d_0$ and $\epsilon_0$ respectively denote the thickness and the specific dielectric constant of the gate insulating layer 112 situated in an under-gate region sandwiched between the gate electrode 118 and the first semiconductor crystal layer 106, $d_1$ and $\epsilon_1$ respectively denote the thickness and the specific dielectric constant or the first semiconductor crystal layer 106 situated in the under-gate region, V denotes the voltage that is applied to the gate electrode 118 and is equal to or higher than the threshold voltage of the field-effect transistor 100, and $\delta = E_{a2} - E_{a1}$. When the relation expressed by Formula 1 is satisfied with V being equal to or higher than the threshold voltage of the field-effect transistor 100 and with carriers moving between the source electrode 114 and the drain electrode 116 of the field-effect transistor 100, high-mobility channel electrons can be induced in the second semiconductor crystal layer 104 that is in contact with the first semiconductor crystal layer 106. The relation expressed by Formula 1 can be derived in the following manner.

The capacitance $C_0$ of the gate insulating layer 112 is expressed as follows, $$C_0 = \epsilon_0 / d_0 \quad \text{Formula 2}$$

Thus, the electrical charge $Q_0$ induced at the interlace between the gate insulating layer 112 and the first semiconductor crystal layer 106 is expressed as follows.

$$Q_0 = V \times C_0 = V \times \epsilon_0 / d_0 \quad \text{Formula 3}$$

Here, the combined capacitances of the gate insulating layer 112 and the first semiconductor crystal layer 106 are expressed as follows.

$$C_0 = \epsilon_0 \cdot \epsilon_1 / (d_0 \epsilon_1 + d_1 \epsilon_0) \quad \text{Formula 4}$$

Thus, the electrical charge Q1 induced at the interlace between the first semiconductor crystal layer 106 and the second semiconductor crystal layer 104 is expressed as follows.

$$Q_1 = (V+\delta) \times C_1 = (V+\delta) \times \epsilon_0 \cdot \epsilon_1 / (d_0 \epsilon_1 + d_1 \epsilon_0) \quad \text{Formula 5}$$

Here, when $Q_1 > Q_0$ (Formula 6), high-mobility channel electrons are generated in the second semiconductor crystal layer 104. By substituting Formulas 3 and 5 into Formula 6, Formula 7 is obtained.

$$(V+\delta) \times \epsilon_0 \cdot \epsilon_1 / (d_0 \epsilon_1 + d_1 \epsilon_0) > V \times \epsilon_0 / d_0 \quad \text{Formula 7}$$

By sorting out Formula 7, the relation $(\epsilon_1 \cdot d_0)/(\epsilon_0 \cdot d_1) > V/\delta$ expressed by Formula 1 is obtained. In other words, when the relation expressed by Formula 1 is satisfied, high-mobility channel electrons can be induced within the second semiconductor crystal layer 104 that is in contact with the first semiconductor crystal layer 106.

As explained above, the first semiconductor crystal layer 106 is formed between the gate insulating layer 112 and the second semiconductor crystal layer 104 in the field-effect transistor 100. Therefore, the interface between the second semiconductor crystal layer 104 and the first semiconductor crystal layer 106 is distant from the interface between the gate insulating layer 112 and the second semiconductor crystal layer 104 by a distance corresponding to the thickness of the first semiconductor crystal layer 106. With such arrangement, the carriers are less likely to be scattered even if trap centers are present at the interlace between the gate insulating layer 112 and the first semiconductor crystal layer 106. As a consequence, the carrier mobility can be increased. Furthermore, the short channel effect can be reduced by the improved controllability of the channel electrons by the gate electrode, which results from the increased carrier density that is achieved by the P-type second semiconductor crystal layer 104.

Figure 2:
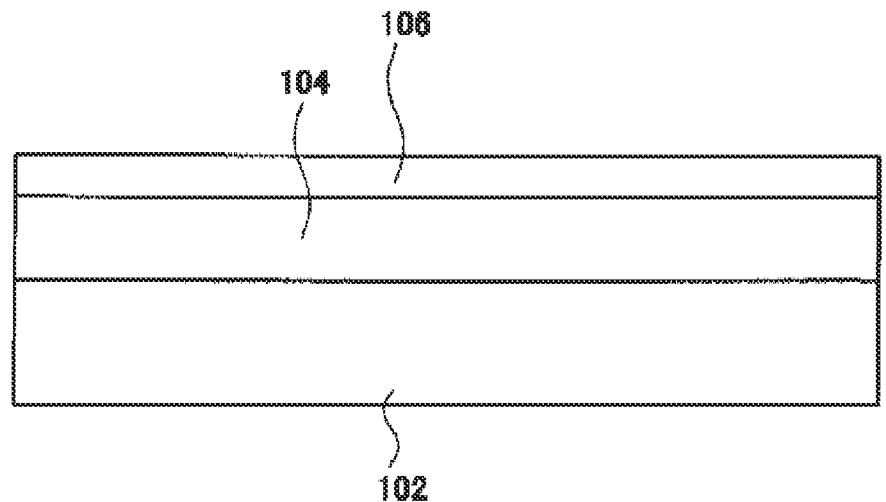
FIG. 2 illustrates an exemplary cross-section observed during an exemplary producing process of the field-effect transistor 100.
Figure 3:
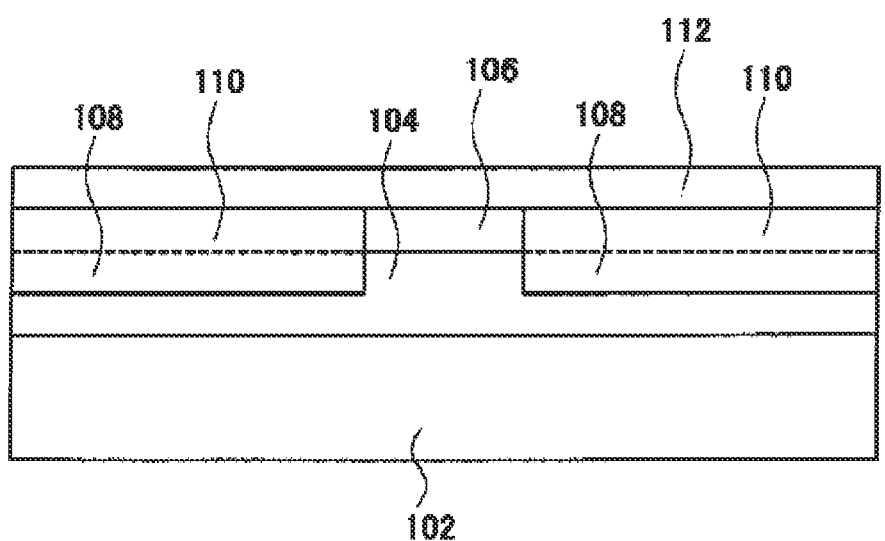
FIG. 3 illustrates an exemplary cross-section observed during an exemplary producing process of the field-effect transistor 100.
Figure 4:
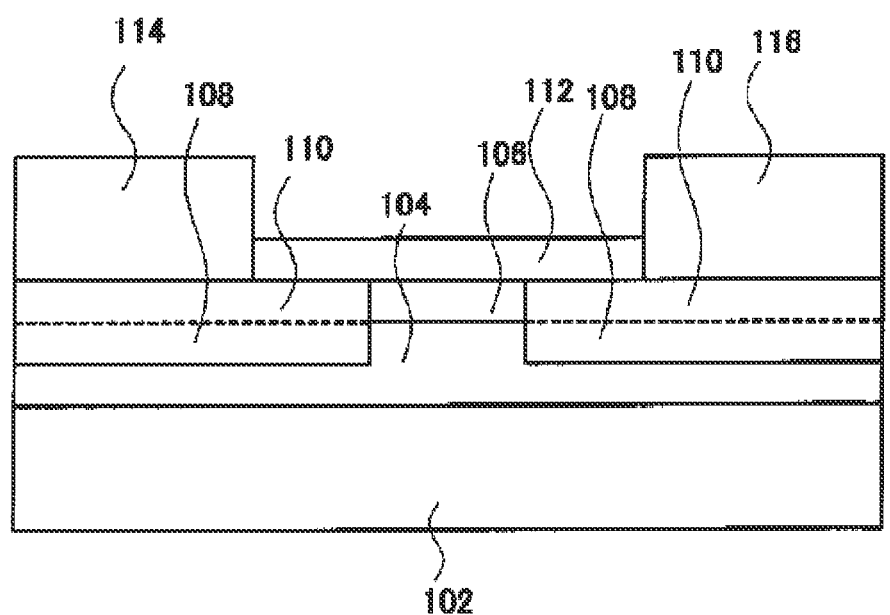
FIG. 4 illustrates an exemplary cross-section observed during an exemplary producing process of the field-effect transistor 100.

FIGS. 2 to 4 illustrate exemplary cross-sections observed during the producing process according to an exemplary method of producing the field-effect transistor 100. As shown in FIG. 2, the second semiconductor crystal layer 104 and the first semiconductor crystal layer 106 are stacked on the base wafer 102 in the stated order. The second semiconductor crystal layer 104 and the first semiconductor crystal layer 106 are formed by, for example, epitaxial growth based on a metal organic chemical vapor deposition (MOCVD) method, or by a molecular beam Epitaxy (MBE) method.

As shown in FIG. 3, the second N-type regions 108 are formed in the second semiconductor crystal layer 104, the first N-type regions 110 are formed in the first semiconductor crystal layer 106, and the gate insulating layer 112, is further formed. The second N-type regions 108 and the first N-type regions 110 are formed by ion implantation, according to which N-type impurity atoms are ionized and introduced. The N-type impurity atoms are, for example, Si atoms. For the ion implantation, a sacrificial layer (not shown) is preferably formed on the first N-type regions 110 in advance. Annealing is preferably performed after the ion implantation.

When the sacrificial layer is formed, the gate insulating layer 112 is formed after the sacrificial layer is removed. The gate insulating layer 112 is formed by, for example, an ALD method. The gate insulating layer 112 is preferably formed by an ALD or MOCVD method in an atmosphere containing a reducing material. The reducing material is, for example, hydrogen ($H_2$), or trimethylaluminum ($Al(CH_3)_3$).

As shown in FIG. 4, portions of the gate insulating layer 112 that are positioned on the first N-type regions 110 are removed by etching, so that the source electrode 114 and the drain electrode 116 are formed. When the source electrode 114 and the drain electrode 116 are formed by a metal stack film made up by Ti and Au, patterning is performed by combining thin-film formation based on evaporation or sputtering with a lift-off technique, for example. Finally, the gate electrode 118 is formed on the gate insulating layer 112. When the gate electrode 118 is formed by a metal stack film made up by Ti and Au, the gate electrode 118 may be formed in a similar manner to the source electrode 114 and the drain electrode 116.

When a single-crystal compound semiconductor wafer such as a single-crystal GaAs wafer or a single-crystal InP wafer is used as the base wafer 102, the base wafer 102 can be recycled. For example, a peel-off layer is disposed between the base wafer 102 and the second semiconductor crystal layer 104 and a stack structure including the gate insulating layer 112, the first semiconductor crystal layer 106 and the second semiconductor crystal layer 104 is formed on the peel-off layer. By removing the peel-off layer using etching or the like, the stack structure arranged on the peel-off layer is peeled off the base wafer 102. The peeled-off stack structure may be used to fabricate an electronic element, and the remaining base wafer 102 may be recycled as a base wafer for a new stack structure. The peeled-off stack structure can be attached to a single-crystal Si wafer, a silicon-on-insulator (SOI) wafer, a glass wafer, a ceramics wafer, or a plastic wafer. An electronic element is formed in the stack structure that has been attached to such a wafer.

While the field-effect transistor 100 has been described in the above embodiment, the configuration of a semiconductor wafer can also be understood from the above description.

Specifically speaking, a semiconductor wafer is disclosed that includes the base wafer 102, the second semiconductor crystal layer 104 in contact with the base wafer 102, the first semiconductor crystal layer 106 lattice-matching or pseudo lattice-matching the second semiconductor crystal layer 104. Here, the first semiconductor crystal layer 106 is made of $In_{x1}Ga_{1-x1}As_{y1}P_{1-y1}$ (0<x1≤1, 0≤y1≤1), the second semiconductor crystal layer 104 is made of $In_{x2}Ga_{1-x2}As_{y2}P_{1-y2}$ (0≤x2≤1, 0≤y2≤1, y2≠y1), and the electron affinity $E_{a1}$ of the first semiconductor crystal layer 106 is lower than the electron affinity $E_{a2}$ of the second semiconductor crystal layer 104. A method for producing a semiconductor wafer is also disclosed.

Figure 5:
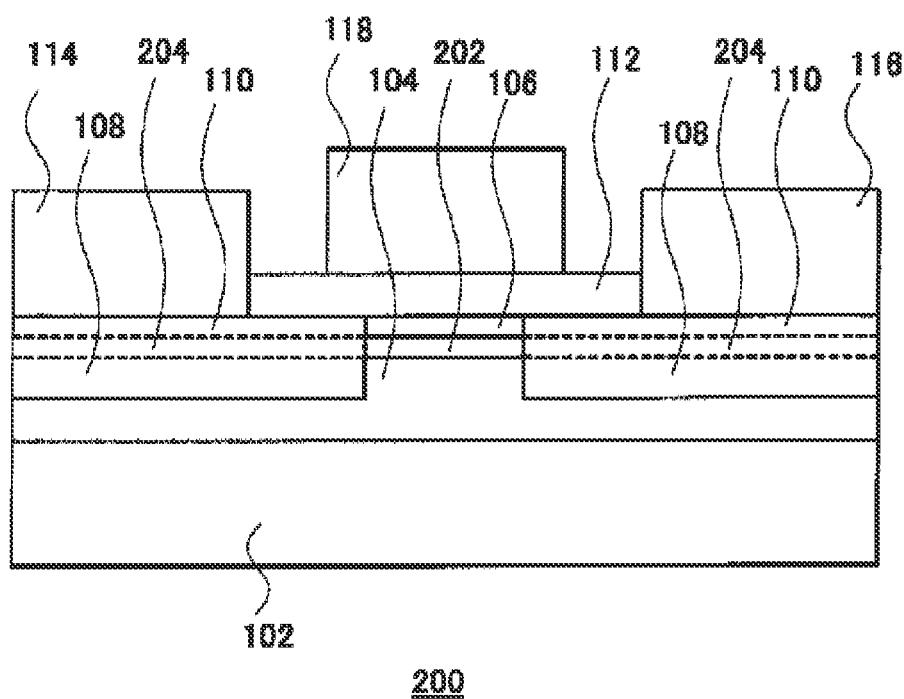
FIG. 5 illustrates an exemplary cross-section of a field-effect transistor 200.

FIG. 5 shows an exemplary cross-section of a field-effect transistor 200 relating to an embodiment of the present invention. The field-effect transistor 200 has the same configuration as the field-effect transistor 100 except for that a third semiconductor crystal layer 202 is included. The following describes the difference between the field-effect transistor 200 and the field-effect transistor 100.

The third semiconductor crystal layer 202 is positioned between the first semiconductor crystal layer 106 and the second semiconductor crystal layer 104. The third semiconductor crystal layer 202 lattice-matches or pseudo lattice matches the second semiconductor crystal layer 104. The third semiconductor crystal layer 202 is, for example, made of $Al_{x3}In_{x4}Ga_{1-x3-x4}As_{y3}P_{1-y3}$ (0<x3<1, 0≤x4<1, 0<x3+x4<1, 0≤y3≤1). The electron affinity $E_{a3}$ of the third semiconductor crystal layer 202 is lower than the electron affinity $E_{a2}$ of the second semiconductor crystal layer 104.

Specifically speaking, when the first semiconductor crystal layer 106 is made of InP, the third semiconductor crystal layer 202 is made of AlInAs and the second semiconductor crystal layer 104 is made of InGaAs, for example. When the first semiconductor crystal layer 106 is made of InGaP, the third semiconductor crystal layer 202 is made of AlGaAs and the second semiconductor crystal layer 104 is made of InGaAs, for example. When the first semiconductor crystal layer 106 is made of InGaP, the third semiconductor crystal layer 202 is made of AlGaAsP and the second semiconductor crystal layer 104 is made of InP, for example. Between the first semiconductor crystal layer 106 and the second N-type regions 108, third N-type regions 204 are formed. The third N-type regions 204 are N-type layers constituting part of the third semiconductor crystal layer 202.

At the junction between the first semiconductor crystal layer 106 and the second semiconductor crystal layer 104, the components of the first semiconductor crystal layer 106 and the second semiconductor crystal layer 104 may abnormally diffuse to disturb the crystal structure. By providing the field-effect transistor 200 with the third semiconductor crystal layer 202, such disturbance in the crystal structure can be prevented. Specifically speaking, when the field-effect transistor 200 includes a third semiconductor crystal layer 202 containing aluminum (Al), Al is thought to prevent the abnormal diffusion, thereby reducing the disturbance in the crystal structure. As a result, the field-effect transistor 200 can achieve increased carrier mobility. Note that the configuration of the field-effect transistor 200 can also be understood as the configuration a semiconductor wafer.

Figure 6:
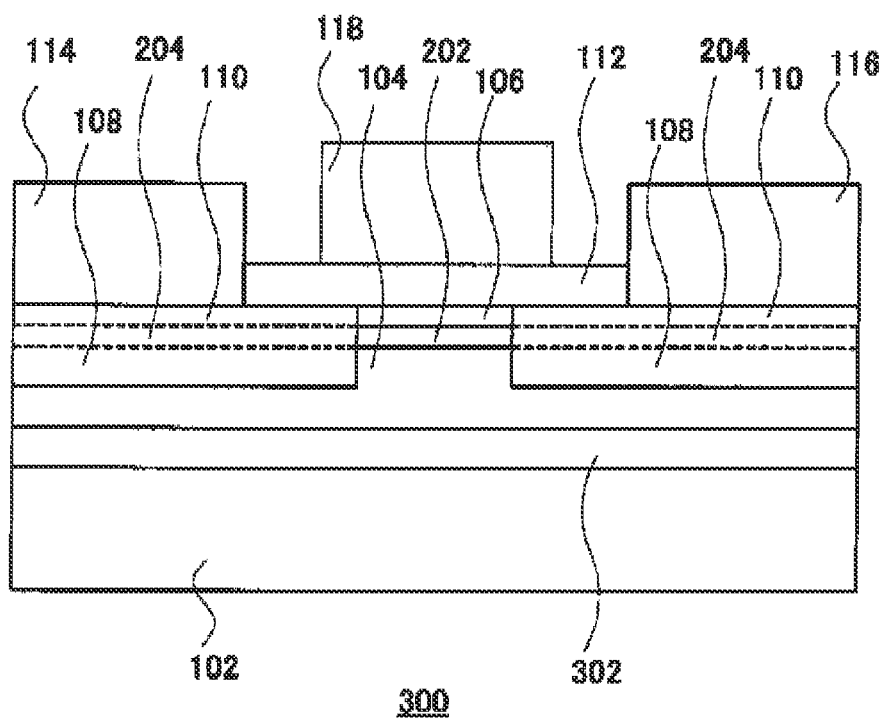
FIG. 6 illustrates an exemplary cross-section of a field-effect transistor 300.

FIG. 6 illustrates an exemplary cross-section of a field-effect transistor 300 relating to an embodiment of the present invention. The field-effect transistor 300 has the same configuration as the field-effect transistor 200 except fix that a fourth semiconductor crystal layer 302 is provided. The following describes the difference between the field-effect transistor 300 and the field-effect transistor 200.

The fourth semiconductor crystal layer 302 has P-type conductivity, and the gate insulating layer 112, the second semiconductor crystal layer 104 and the fourth semiconductor crystal layer 302 are arranged in the order of the gate insulating layer 112, the second semiconductor crystal layer 104 and the fourth semiconductor crystal layer 302. The fourth semiconductor crystal layer 302 lattice matches or pseudo lattice-matches the second semiconductor crystal layer 104. The electron affinity $E_{a4}$ of the fourth semiconductor crystal layer 302 is lower than the electron affinity $E_{a2}$ of the second semiconductor crystal layer 104.

The existence of the fourth semiconductor crystal layer 302 may produce the same effects as when the second semiconductor crystal layer 104 has P-type conductivity. In other words, the fourth semiconductor crystal layer 302 prevents the electron cloud formed in the vicinity of the interface between the third semiconductor crystal layer 202 and the first semiconductor crystal layer 106 from diffusing into the second semiconductor crystal layer 104. This further increases the density of the electron cloud at the interface, thereby improving the controllability of the channel electrons by the gate electrode. The configuration of the field-effect transistor 300 can also be understood as the configuration of a semiconductor wafer.

Figure 7:
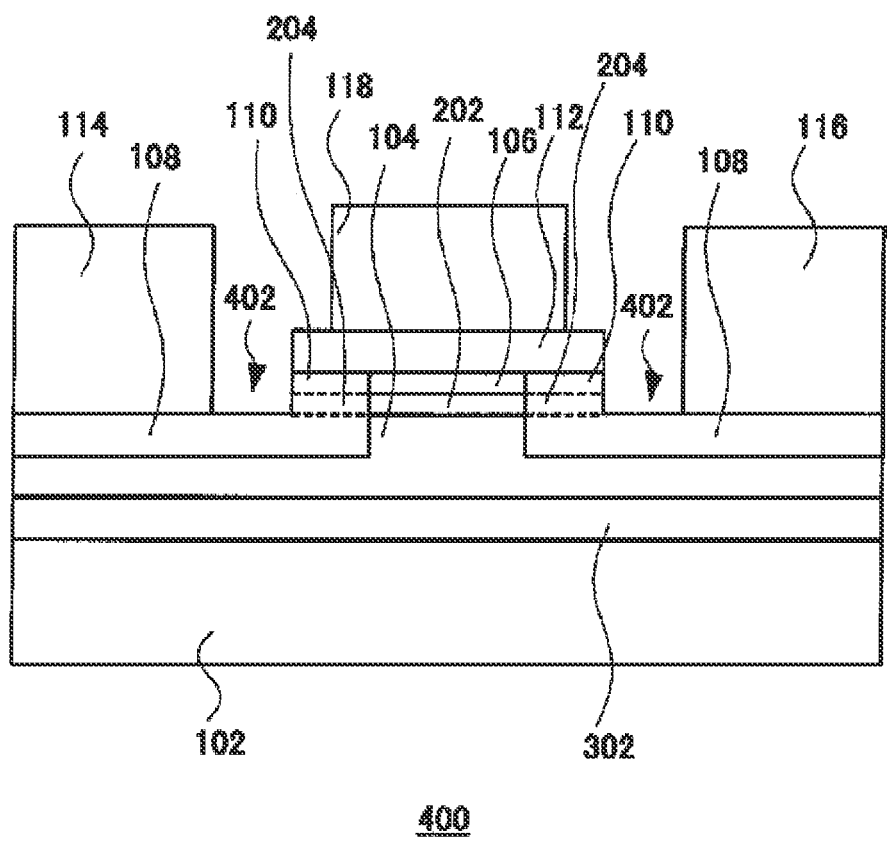
FIG. 7 illustrates an exemplary cross-section of a field-effect transistor 400.

FIG. 7 illustrates an exemplary cross-section of the field-effect transistor 400 relating to an embodiment of the present invention. The field-effect transistor 400 has the same configuration as the field-effect transistor 300 except for that a recess 402 is provided. The following describes the difference between the field-effect transistor 400 and the field-effect transistor 300.

A first direction is defined as the direction in which the gate electrode 118, the gate insulating layer 112 and the first semiconductor crystal layer 106 are arranged in the stated order. A second direction is defined as the direction in which the source electrode 114, the gate electrode 118 and the drain electrode 116 are arranged in the stated order. The first direction and the second direction substantially cross perpendicularly. In an under-gate region that is adjacent to the gate electrode 118 in the first direction, the first semiconductor crystal layer 106 is formed. The existence of the first semiconductor crystal layer 106 may produce effects of increasing the carrier mobility.

The first semiconductor crystal layer 106 and the third semiconductor crystal layer 202 are not formed between the under-gate region and the source electrode 114. The first semiconductor crystal layer 106 and the third semiconductor crystal layer 202 are not formed between the under-gate region and the drain electrode 116. In other words, recesses 402, in which the first semiconductor crystal layer 106 and the third semiconductor crystal layer 202 are not formed, are formed between the under-gate region and the source electrode 114 and between the under-gate region and the drain electrode 116.

The recesses 402 prevent the carriers from being injected into the interface between the gate insulating layer 112 and the first semiconductor crystal layer 106 or the interface between the first semiconductor crystal layer 106 and the third semiconductor crystal layer 202. Accordingly, the carriers are injected into the vicinity of the interface between the third semiconductor crystal layer 202 and the second semiconductor crystal layer 104. As a result, the field-effect transistor 400 achieves superior on characteristics.

The first semiconductor crystal layer 106 and the third semiconductor crystal layer 202 may be formed in an under-source region that is adjacent to the source electrode 114 in the first direction, and the first semiconductor crystal layer 106 and the third semiconductor crystal layer 202 may be formed in an under-drain region that is adjacent to the drain electrode 116 in the first direction. In this case, recesses in which the first semiconductor crystal layer 106 and the third semiconductor crystal layer 202 are not formed are formed between the under-gate region and the under-source region and between the under-gate region and the under-drain region.

First Working Example

Figure 8:
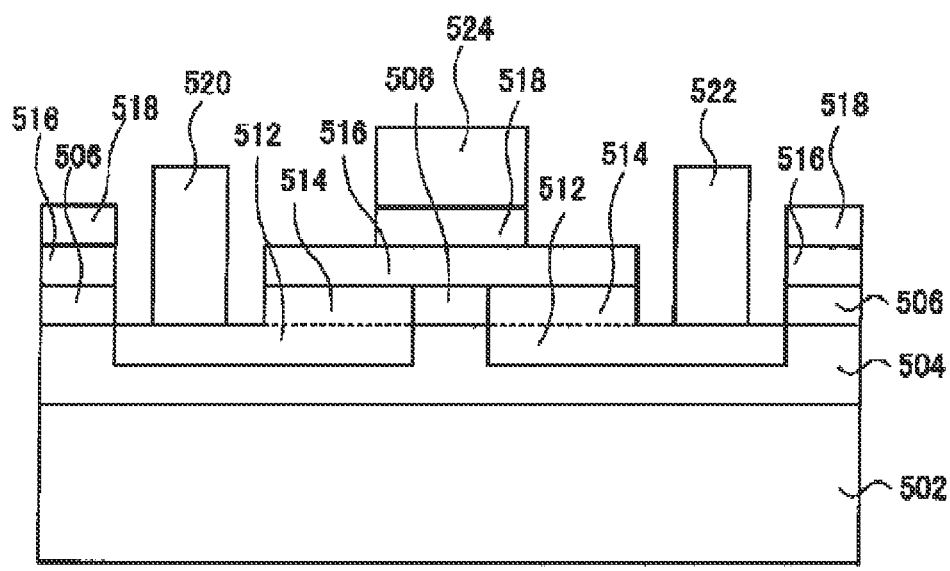
FIG. 8 illustrates the cross-section of a field-effect transistor 500.

FIG. 8 is a cross-sectional view illustrating a field-effect transistor 500 relating to a working example of the present invention. FIGS. 9 to 14 show the cross-sections observed during the producing process of the field-effect transistor 500.

Figure 9:
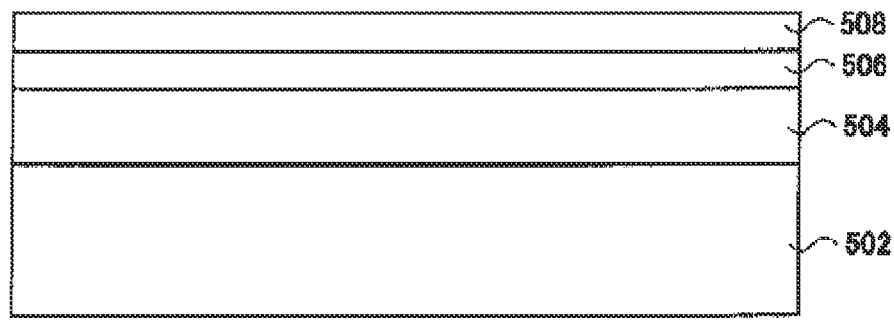
FIG. 9 illustrates a cross-section observed during the producing process of the field-effect transistor 500.

As shown in FIG. 9, a P-type InP wafer 502 was provided. On the (001) plane of the InP wafer 502, a P-type InGaAs layer 504 and an I-type InP layer 506 were epitaxially grown. Referring to the InGaAs layer 504, the composition was $In_{0.53}Ga_{0.47}As$ and the concentration of the P-type impurities was $3 \times 10^{16}$ cm$^{-3}$. On the InP layer 506, a sacrificial protective layer 508 was formed to prevent Group VB atoms from leaking. As the sacrificial protective layer 508, $Al_2O_3$ was formed to a thickness of 6 nm.

Figure 10:
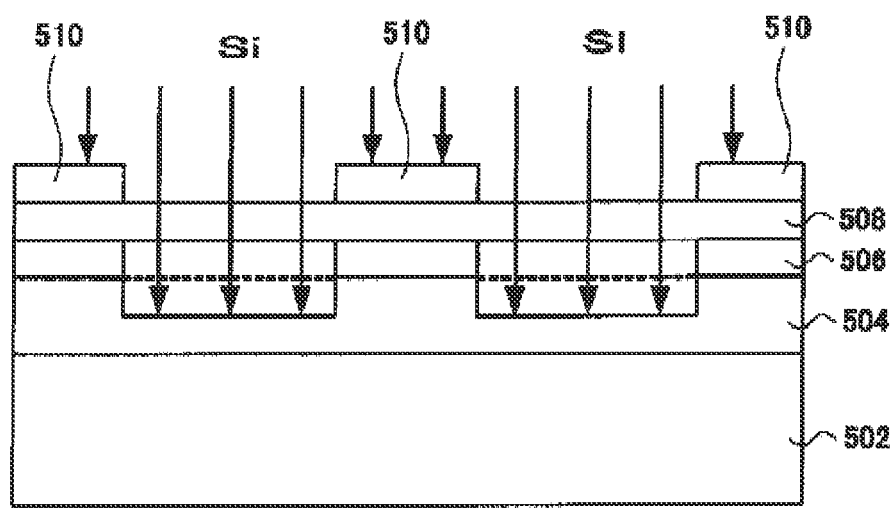
FIG. 10 illustrates a cross-section observed during the producing process of the field-effect transistor 500.

As shown in FIG. 10, a mask 510 was formed and Si atoms were introduced by ion implantation. The ion implantation was performed with an implantation energy of 30 keV and an implantation amount of $2 \times 10^{14}$ cm$^{-2}$.

Figure 11:
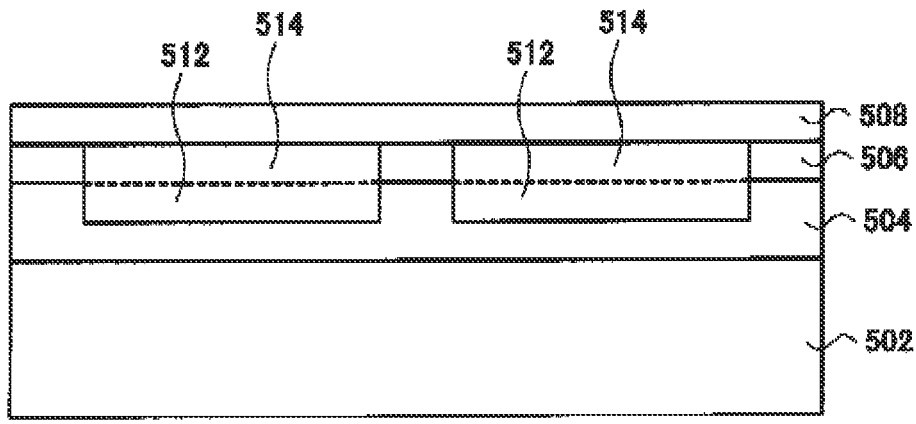
FIG. 11 illustrates a cross-section observed during the producing process of the field-effect transistor 500.

As shown in FIG. 11, the introduced Si atoms were activated by rapid thermal anneal (RTA). In this manner, an N-type layer 512 of the InGaAs layer 504 was formed and an N-type layer 514 of the InP layer 506 was formed. The RTA was performed at 600° C. for 10 seconds.

Figure 12:
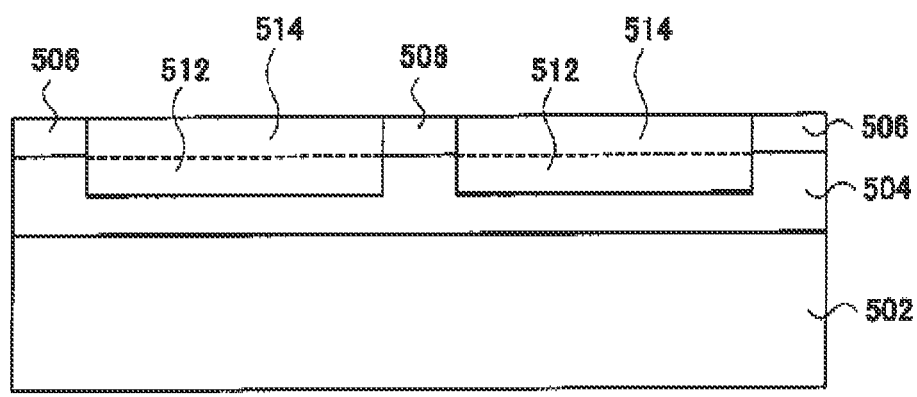
FIG. 12 illustrates a cross-section observed during the producing process of the field-effect transistor 500.

As shown in FIG. 12, the sacrificial protective layer 508 was peeled off and the surface was cleaned. To peel off the sacrificial protective layer 508 and clean the surface, etching was performed by means of buffered hydrofluoric acid (BHF), and by means of diluted hydrofluoric acid (DHF) and ammonium hydroxide ($NH_4OH$).

Figure 13:
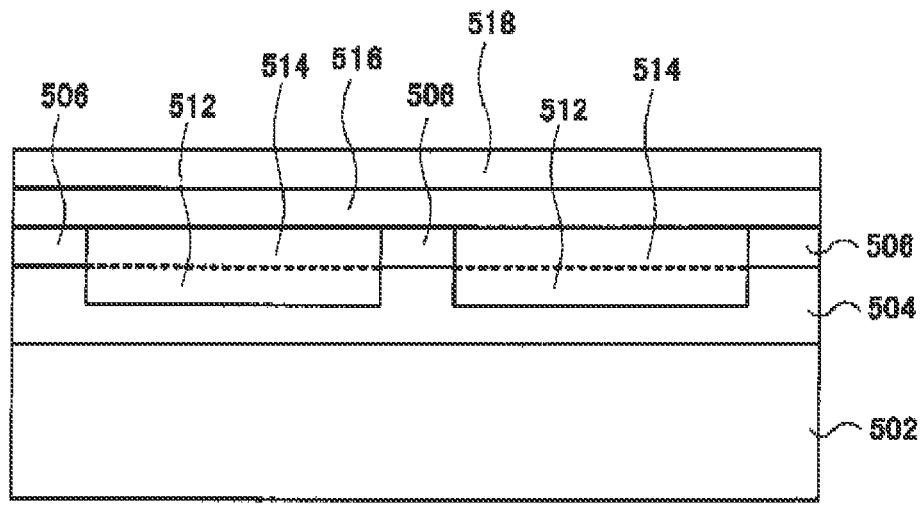
FIG. 13 illustrates a cross-section observed during the producing process of the field-effect transistor 500.

As shown in FIG. 13, an $Al_2O_3$ layer 516 and a TaN layer 518 were formed. The $Al_2O_3$ layer 516 was formed by ALD to a thickness of 13 nm. The TaN layer 518 was formed by ion beam sputtering to a thickness of 30 nm.

Figure 14:
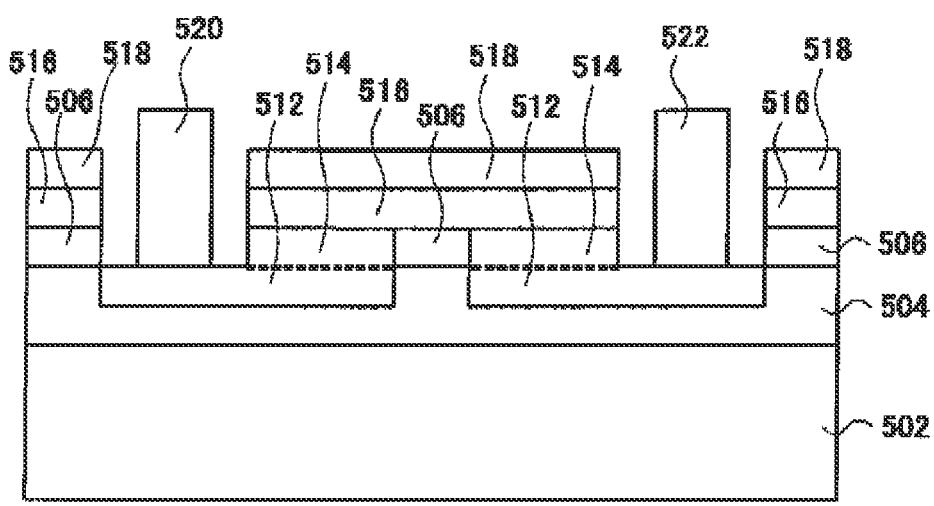
FIG. 14 illustrates a cross-section observed during the producing process of the field-effect transistor 500.

As shown in FIG. 14, source and drain contact holes were formed, and a source electrode 520 and a drain electrode 522 were formed in the contact holes. The contact holes were formed by performing dry etching on the TaN layer 518 based on reactive ion etching using $SF_6$ as the etching gas and subsequently performing wet etching on the $Al_2O_3$ layer 516 using BHF as the etching solution. After a mask was formed, a stack film made up by Ti and Au was formed using evaporation and a lift-off technique was applied to peel off the mask. In this way, the source electrode 520 and the drain electrode 522 were formed.

Furthermore, a stack film made up by Ti and Au was formed using evaporation after forming a mask, and a lift-off technique was then applied to peel oil the mask. In this way, the gate electrode 524 was formed. Subsequently, dry etching was performed on the TaN layer 518 using reactive ion etching using $SF_6$ as the etching as to form the gate electrode 524 and isolate the electrodes from each other. In the above-described manner, the field-effect transistor 500 shown in FIG. 8 was produced.

As a comparative example, a field-effect transistor was produced without the InP layer 506. In this field-effect transistor, the thickness of the InGaAs layer was adjusted to be equal to sum of the thickness of the InGaAs layer 504 and the thickness of the InP layer 506.

Figure 15:
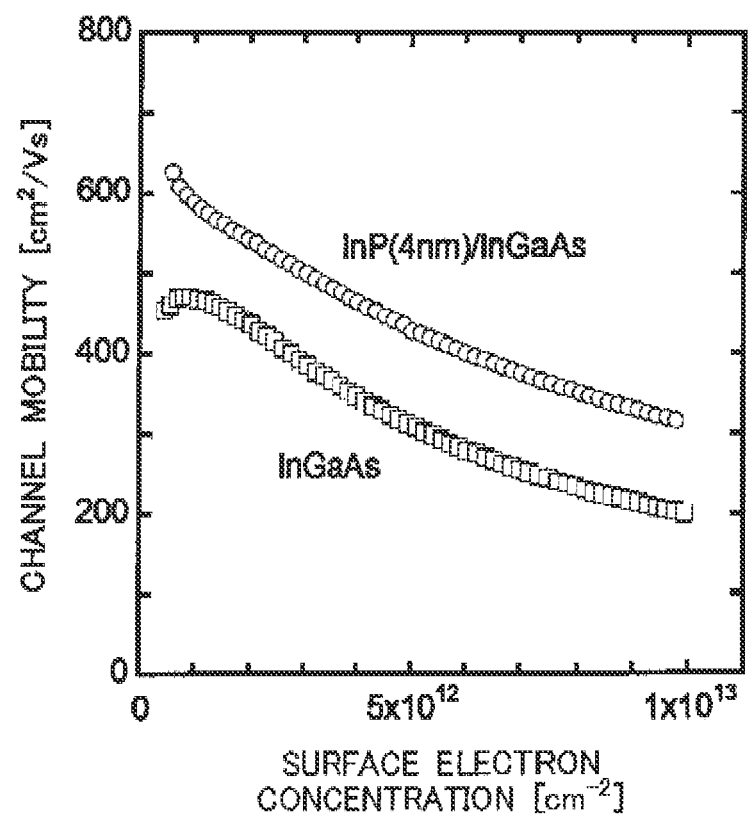
FIG. 15 is a graph showing the relation between the channel mobility and the surface electron concentration, obtained from experiments, for the field-effect transistor 500 and as field-effect transistor of a comparative example.

FIG. 15 is a graph showing the relation between the channel mobility and the surface electron concentration, obtained from experiments, for the field-effect transistor 500 and the field-effect transistor of the comparative example. Comparing the data for the field-effect transistor 500, which is represented by the circles and indicated by "InP (4 nm)/InGaAs" with the data for the comparative example, which is represented by the squares and indicated by "InGaAs," reveals that the field-effect transistor 500 achieves higher channel mobility. In other words, the experimental data shown in FIG. 15 has proved that the existence of the InP layer 506, which is equivalent to the first semiconductor crystal layer 106, enables the field-effect transistor 500 to achieve increased channel mobility.

Second Working Example

Figure 16:
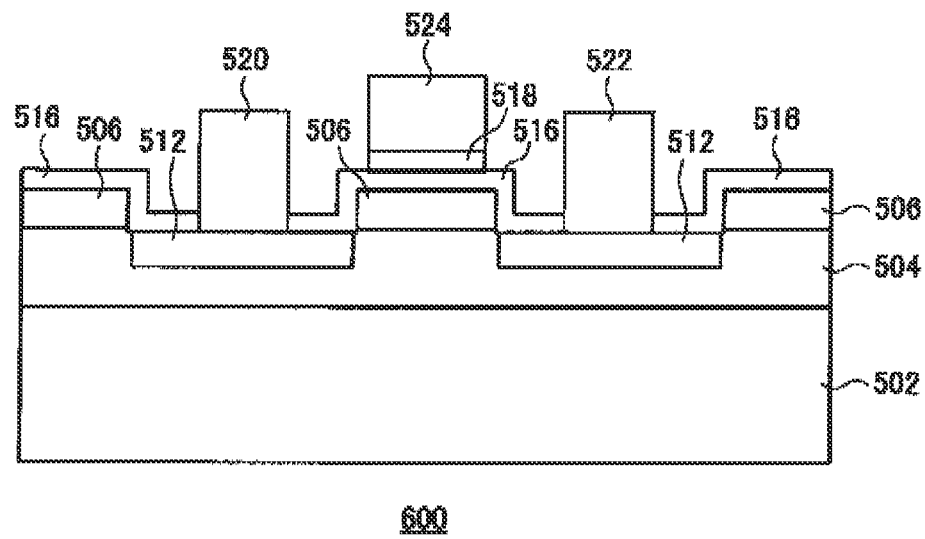
FIG. 16 is a cross-sectional view showing a field-effect transistor 600.

FIG. 16 is a cross-sectional view illustrating a field-effect transistor 600 relating to another working example of the present invention. The field-effect transistor 600 does not have the N-type layer 514 of the InP layer 506, which constitutes part of the field-effect transistor 500.

Figure 17:
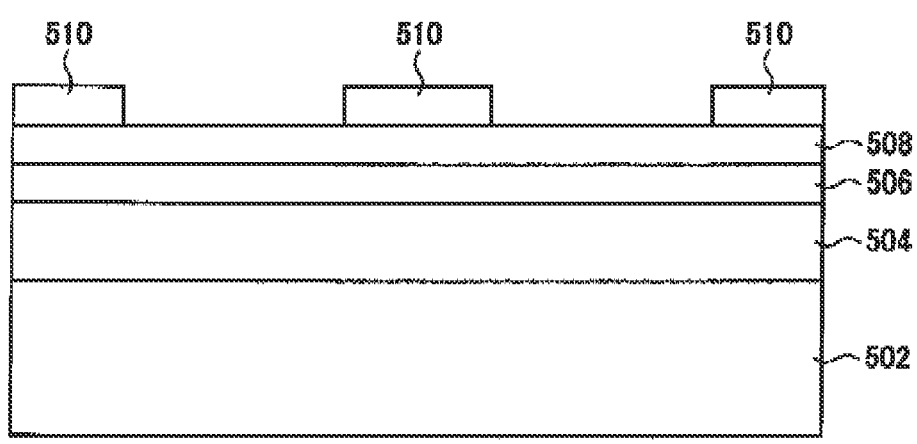
FIG. 17 illustrates a cross-section observed during the producing process of the field-effect transistor 600.

FIGS. 17 to 24 illustrate cross-sections observed during the producing process of the field-effect transistor 600. As in the first working example, a P-type InGaAs layer 504 and an I-type InP layer 506 were epitaxially grown on a P-type InP wafer 502, and a sacrificial protective layer 505 was formed on the InP layer 506 as shown in FIG. 17. The respective layers have the same compositions, impurity concentrations and thicknesses as in the first working example. On the sacrificial protective layer 508, a mask 510 was formed. The mask 510 was a photoresist film and formed to cover a region in which the gate electrode 524 was to be formed.

Figure 18:
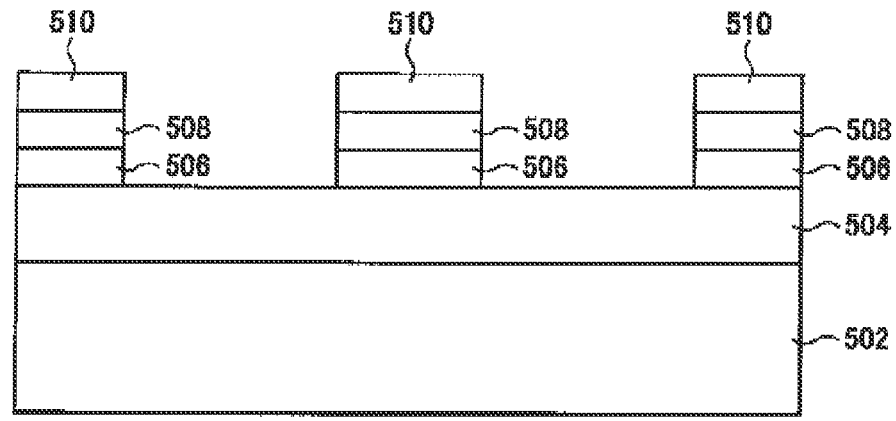
FIG. 18 illustrates a cross-section observed during the producing process of the field-effect transistor 600.
Figure 19:
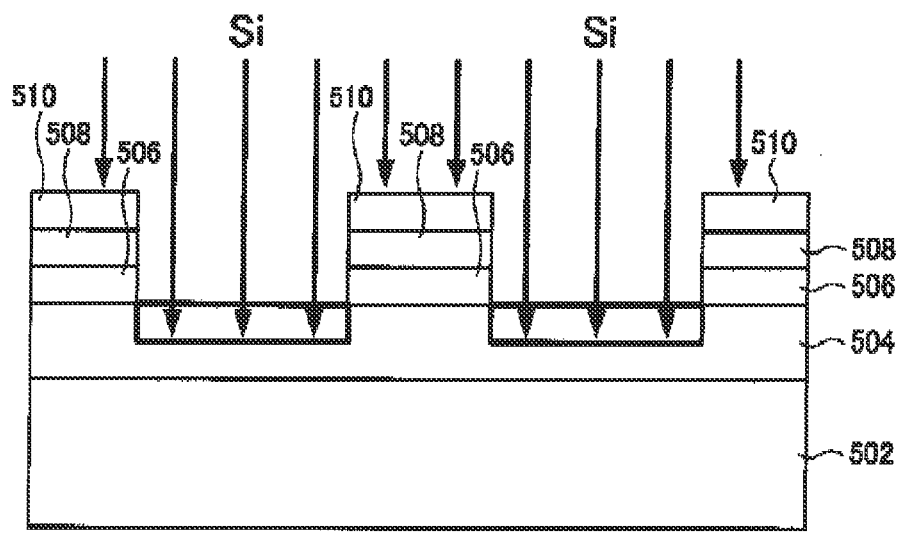
FIG. 19 illustrates a cross-section observed during the producing process of the field-effect transistor 600.

As shown in FIG. 18, the mask 510 was used as a shielding film to remove portions of the sacrificial protective layer 508 and the InP layer 506 by etching. Subsequently, as shown in FIG. 19, the mask 510 was again used as a shielding film to introduce Si atoms into the InGaAs layer 504 by ion implantation in the regions from which the sacrificial protective layer 508 and the InP layer 506 had been removed. The ion implantation was performed with an implantation energy of 30 keV and an implantation amount of $2 \times 10$ cm$^{-2}$, as in the first working example.

Figure 20:
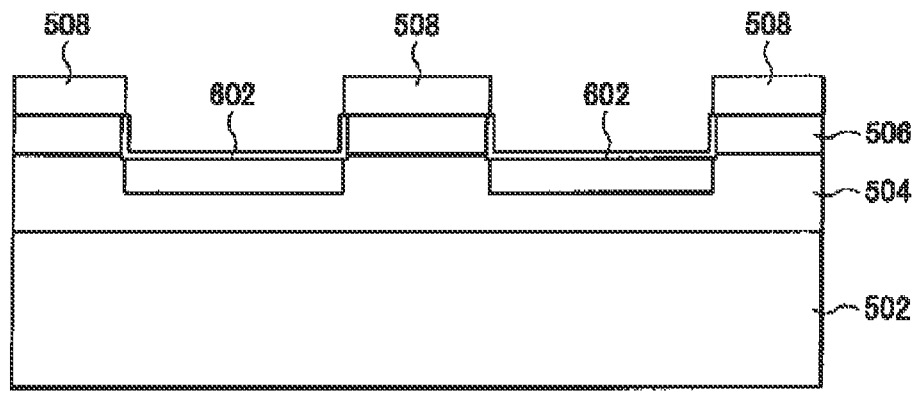
FIG. 20 illustrates a cross-section observed during the producing process of the field-effect transistor 600.
Figure 21:
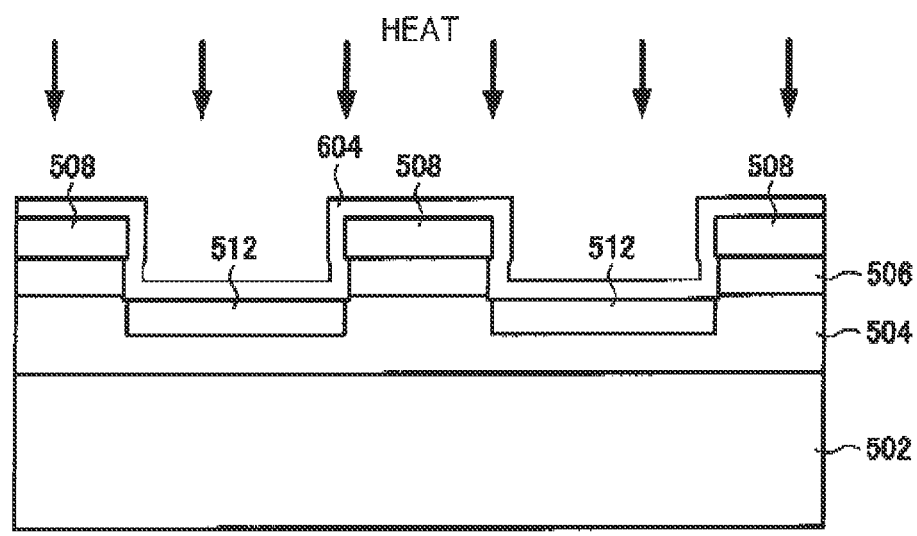
FIG. 21 illustrates a cross-section observed during the producing process of the field-effect transistor 600.

As shown in FIG. 20, the mask 510 was removed by ashing. As a result of the ashing, an oxide 602 was formed. After the oxide 602 was removed by etching, a sacrificial protective layer 604 similar to the sacrificial protective layer 508 was formed as shown in FIG. 21. After this, the implanted Si was activated using RTA. In this way, the N-type layers 512 were formed in the InGaAs layer 504. The RTA was performed at 600° C. for 10 seconds as in the first working example.

Figure 22:
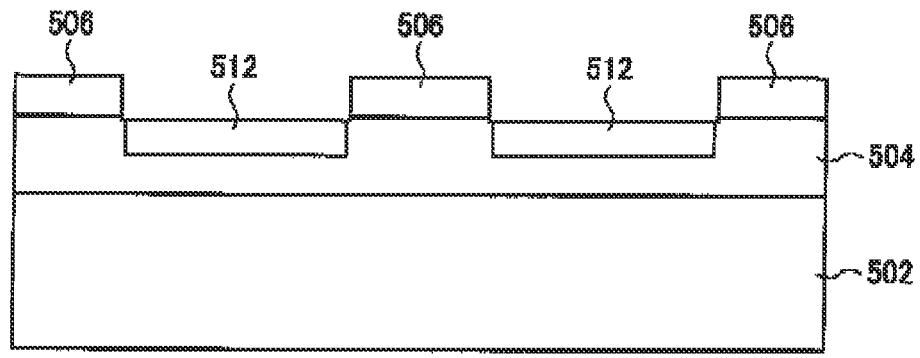
FIG. 22 illustrates a cross-section observed during the producing process of the field-effect transistor 600.
Figure 23:
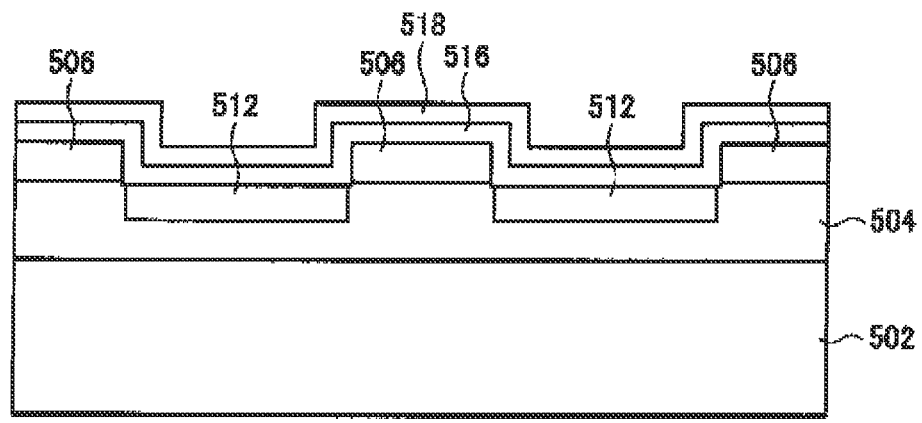
FIG. 23 illustrates a cross-section observed during the producing process of the field-effect transistor 600.
Figure 24:
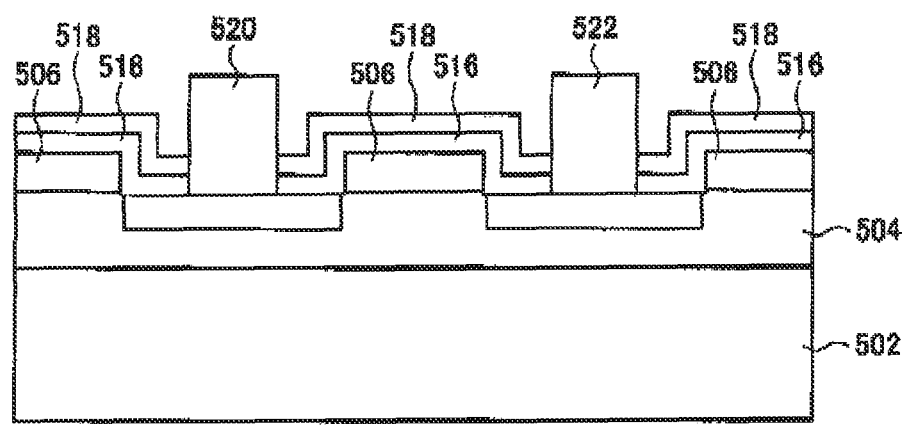
FIG. 24 illustrates a cross-section observed during the producing process of the field-effect transistor 600.

As shown in FIG. 22, the sacrificial protective layer 508 and the sacrificial protective layer 604 were peeled off and the surface was cleaned as in the first working example. Subsequently, as shown in FIG. 23, the $Al_2O_3$ layer 516 and the TaN layer 518 were formed as in the first working example. Subsequently, as shown in FIG. 24, source and drain contact holes were formed, and the source electrode 520 and the drain electrode 522 were formed in the contact holes as in the first working example.

Furthermore, as in the first working example, a stack film made up by Ti and Au was formed using evaporation after forming a mask, and a lift-off technique was then applied to peel of the mask. In this way, the gate electrode 524 was formed. Subsequently, dry etching was performed on the TaN layer 518 using reactive ion etching using $SF_6$ as the etching gas to form the gate electrode 524 and isolate the electrodes from each other. In the above-described manner, the field-effect transistor 600 shown in FIG. 16 was produced.

Since the field-effect transistor 600 relating to the second working example is produced in the above described manner, the N-type layers 514 of the InP layer 506 are not, formed. In the field-effect transistor 500 relating to the first working example, the source-drain voltage is applied to both of the N-type layers 512 of the InGaAs layer 504 and the N-type layers 514 of the InP layer 506. In the field-effect transistor 600 of the second working example, on the other hand, the source-drain voltage is applied only to the N-type layers 512 of the InGaAs layer 504.

While the field-effect transistor 500 of the first working example and the field-effect transistor 600 of the second working example are both designed to form a two-dimensional electron as at the interface between the InGaAs layer 504 and the InP layer 506, another two-dimensional electron gas is likely to be formed at the interface between the $Al_2O_3$ layer 516, which is a gate insulating layer, and the InP layer 506. Since no N-type layers are formed in the InP layer 506 in the field-effect transistor 600 of the second working example, a two-dimensional electron gas may be formed at the interface between the $Al_2O_3$ layer 516 and the InP layer 506 but is highly unlikely to serve as a channel. Therefore, the two-dimensional electron gas formed at the interface that is less affected by the scattering caused by the carrier traps (i.e. the interface between the InGaAs layer 504 and the InP layer 506) can serve as a dominant channel. Consequently, the field-effect transistor 600 could achieve improved performance.

Figure 25:
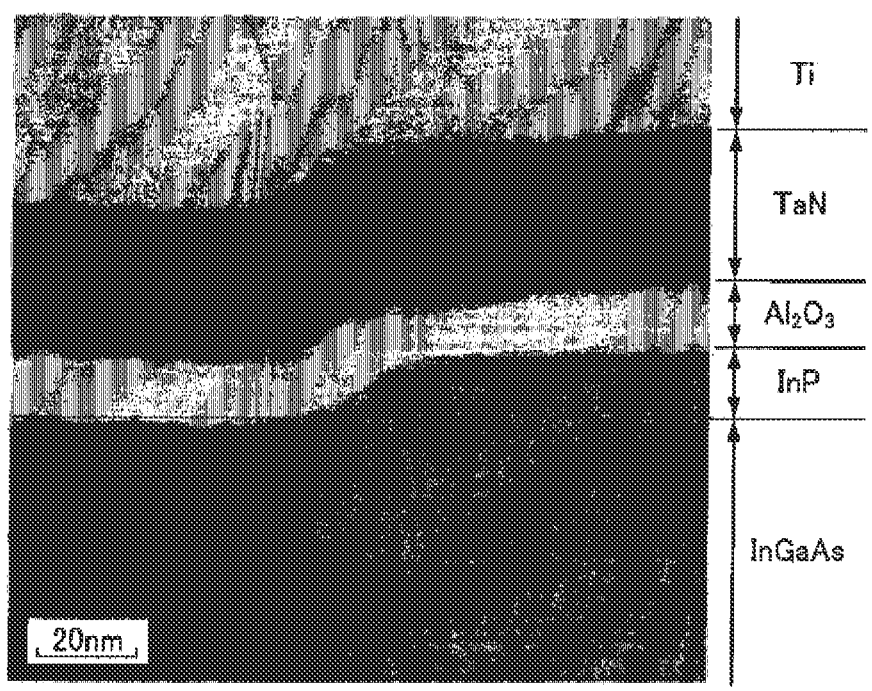
FIG. 25 is a photograph obtained by an electron microscope showing the cross-section at the end of the gate electrode of the field-effect transistor 600.
Figure 26:
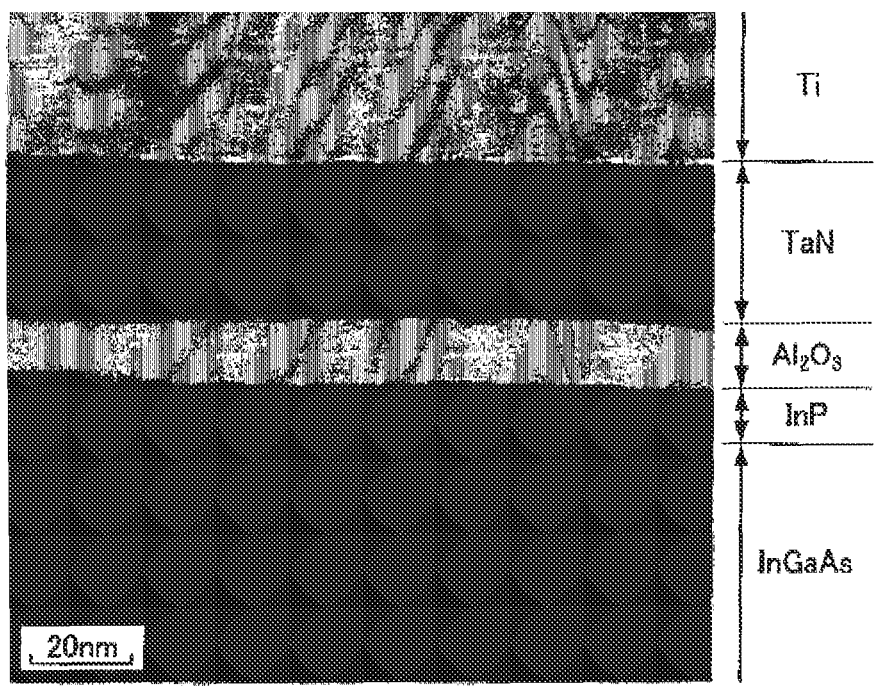
FIG. 26 is a photograph obtained by an electron microscope showing the cross-section at the middle of the gate electrode of the field-effect transistor 600.

FIG. 25 is a photograph obtained by an electron microscope showing the cross-section at the end of the gate electrode of the field-effect transistor 600. FIG. 26 is a photograph obtained by an electron microscope snowing the cross-section at the middle of the gate electrode of the field-effect transistor 600. The photographs could prove that the InP layer 506 was successfully removed at the end of the gate electrode.

Figure 27:
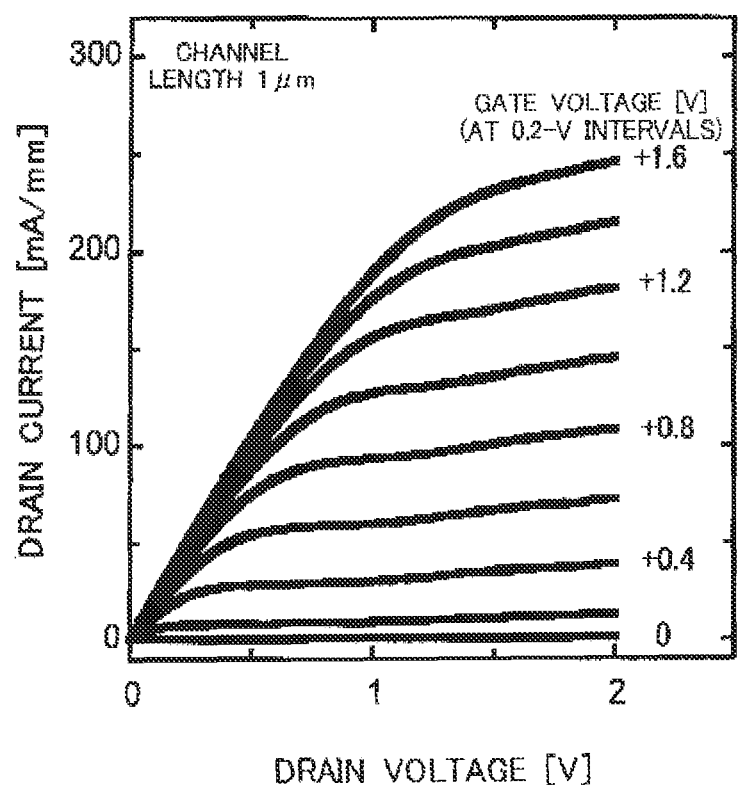
FIG. 27 shows the drain-voltage-drain-current characteristics (Vd-Id characteristics) of the field-effect transistor 600.

FIG. 27 shows the drain-voltage-drain-current characteristics (Vd-Id characteristics) of the field-effect transistor 600. The results shown in FIG. 27 are obtained for the field-effect transistor 600 having a channel length of 1 μm. In FIG. 27, the results were obtained by varying the gate voltage from 0 V to +1.6 V at 0.2-V intervals. The Vd-Id characteristics revealed that the field-effect transistor 600 exhibited superior controllability of the drain currents by the gate voltage.

Figure 28:
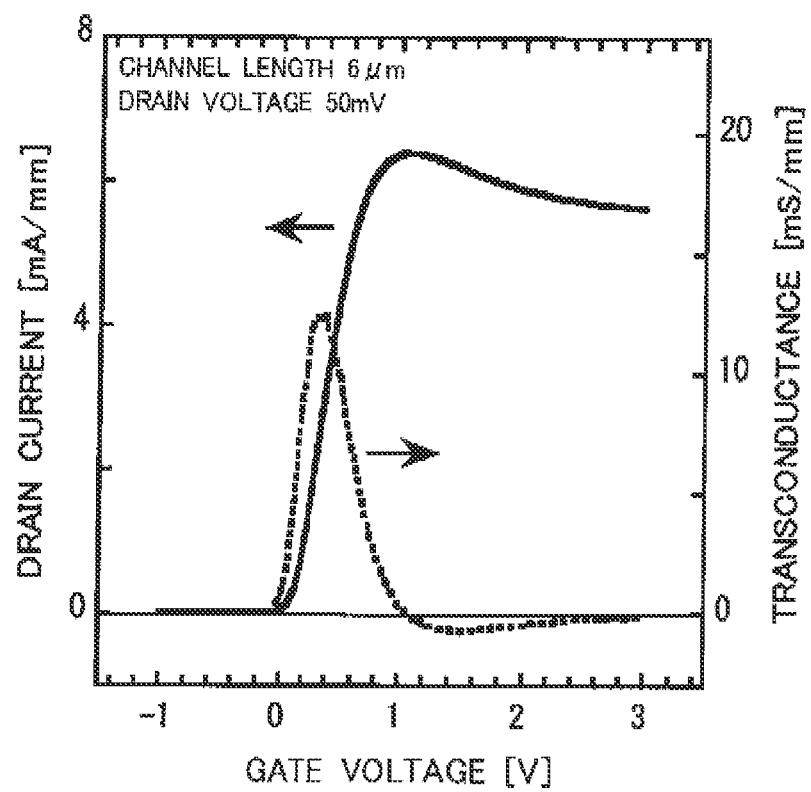
FIG. 28 shows the gate-voltage-drain-current characteristics (Vg-Id characteristics) of the field-effect transistor 600, along with the transconductance.

FIG. 28 shows the gate-voltage-drain-current characteristics (Vg-Id characteristics) of the field-effect transistor 600, along with the transconductance. The results shown in FIG. 28 are obtained for the field-effect transistor 600 having a channel length of 6 μm. The drain voltage was set to 50 mV. The results shown in FIG. 28 proved that the field-effect transistor 600 exhibited superior switching characteristics of the drain currents by the gate voltage. The peak value of the transconductance was approximately 13 mS/mm.

Figure 29:
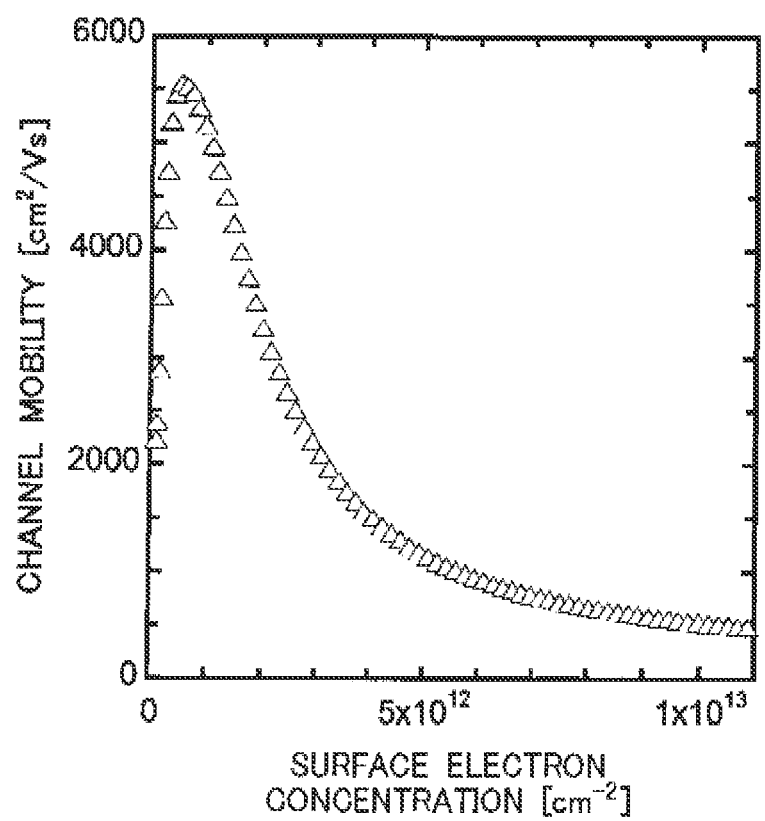
FIG. 29 is a graph showing the relation between the channel mobility and the surface electron concentration or the field-effect transistor 600 obtained by experiments.

FIG. 29 is a graph showing the relation between the channel mobility and the surface electron concentration of the field-effect transistor 600 obtained by experiments. The channel mobility took a high value of approximately 5600 $cm^2$/Vs at its peak. The field-effect transistor 600 achieved highly significant improvement in channel mobility compared with the field-effect transistor 500 shown in FIG. 15.

It should be noted that the operations shown in the claims, specification, and drawings can be performed in any order as long as the order is not particularly indicated by the expressions such as "prior to," "before," or the like and as long as the output from an operation is not to be used in a subsequent operation. A flow of operations may be described using phrases such as "first" or "next" in the claims, specification, or drawings for intelligibility. It, however, does not necessarily mean that the operations must be performed in the stated order.

What is claimed is:

1. A field-effect transistor comprising:
   a gate insulating layer;
   a first semiconductor crystal layer in contact with the gate insulating layer;
   a second semiconductor crystal layer lattice-matching or pseudo lattice-matching the first semiconductor crystal layer, the second semiconductor crystal layer being in contact with a source electrode and a drain electrode, and the source electrode and the drain electrode being in contact with only the second semiconductor crystal layer; and
   a third semiconductor crystal layer lattice-matching or pseudo lattice-matching the second semiconductor crystal layer, wherein the third semiconductor crystal layer is positioned between the first semiconductor crystal layer and the second semiconductor crystal layer, wherein
   the gate insulating layer, the first semiconductor crystal layer, and the second semiconductor crystal layer are arranged in the order of the gate insulating layer, the first semiconductor crystal layer, and the second semiconductor crystal layer,
   the first semiconductor crystal layer is made of $In_{x1}Ga_{1-x1}As_{y1}P_{1-y1}$ ($0<x1\leq1, 0\leq y1\leq1$),
   the second semiconductor crystal layer is made of $In_{x2}Ga_{1-x2}As_{y2}P_{1-y2}$ ($0\leq x2\leq1, 0\leq y2\leq1, y2\neq y1$),
   the third semiconductor crystal layer is made of $Al_{x3}In_{x4}Ga_{1-x3-x4}As_{y3}P_{1-y3}$ ($0<x3<1, 0\leq x4<1, 0<x3+x4<1, 0\leq y3\leq1$),
   the electron affinity $E_{a3}$ of the third semiconductor crystal layer is lower than the electron affinity $E_{a2}$ of the second semiconductor crystal layer, and
   the electron affinity $E_{a1}$ of the first semiconductor crystal layer is lower than the electron affinity $E_{a2}$ of the second semiconductor crystal layer.

2. The field-effect transistor as set forth in claim 1, wherein the second semiconductor crystal layer is made of $In_{x2}Ga_{1-x2}As_{y2}P_{1-y2}$ ($0\leq x2\leq1, 0.1\leq y2\leq1, y2>y1$).

3. The field-effect transistor as set forth in claim 2, wherein the As atom concentration of the first semiconductor crystal layer is 1% or lower.

4. The field-effect transistor as set forth in claim 1, further comprising
   a gate electrode in contact with the gate insulating layer, wherein
   the gate electrode, the gate insulating layer, and the first semiconductor crystal layer are arranged in the order of the gate electrode, the gate insulating layer, and the first semiconductor crystal layer,
   the gate insulating layer and the first semiconductor crystal layer satisfy the relation represented by $$(\in_1 \cdot d_0)/(\in_0 \cdot d_1) > V/\delta,$$

where $d_0$ and $\in_0$ respectively denote the thickness and the specific dielectric constant of the gate insulating layer situated in an under-gate region sandwiched between the gate electrode and the second semiconductor crystal layer, $d_1$ and $\in_1$ respectively denote the thickness and the specific dielectric constant of the first semiconductor crystal layer situated in the under-gate region, V denotes the voltage that is applied to the gate electrode and is equal to or higher than the threshold voltage of the field-effect transistor, and $\delta = E_{a2} - E_{a1}$.

5. The field-effect transistor as set forth in claim 1, wherein at least part of the second semiconductor crystal layer contains an impurity that exhibits P-type conductivity.

6. The field-effect transistor as set forth in claim 5, wherein the second semiconductor crystal layer includes a non-doped layer that is in contact with the first semiconductor crystal layer and free from the impurity, and a doped layer that is in contact with the non-doped layer and contains said impurity.

7. The field-effect transistor as set forth in claim 6, wherein the non-doped layer has a thickness of 20 nm or less.

8. The field-effect transistor as set forth in claim 1, further comprising
a fourth semiconductor crystal layer having P-type conductivity, wherein
the gate insulating layer, the second semiconductor crystal layer, and the fourth semiconductor crystal layer are arranged in the order of the gate insulating layer, the second semiconductor crystal layer, and the fourth semiconductor crystal layer,
the fourth semiconductor crystal layer lattice-matches or pseudo lattice-matches the second semiconductor crystal layer, and
the electron affinity $E_{a4}$ of the fourth semiconductor crystal layer is lower than the electron affinity $E_{a2}$ of the second semiconductor crystal layer.

9. The field-effect transistor as set forth in claim 1, further comprising:
a gate electrode in contact with the gate insulating layer; wherein
the gate electrode, the gate insulating layer, and the first semiconductor crystal layer are arranged in the order of the gate electrode, the gate insulating layer, and the first semiconductor crystal layer in a first direction,
the gate electrode, the source electrode, and the drain electrode are arranged in the order of the source electrode, the gate electrode, and the drain, electrode in a second direction perpendicular to the first direction,
the first semiconductor crystal layer is formed in an under-gate region adjacent to the gate electrode in the first direction,
the first semiconductor crystal layer is not formed between the source electrode and the under-gate region, or between the under-gate region and an under-source region adjacent to the source electrode in the first direction, and
the first semiconductor crystal layer is not formed between the drain electrode and the under-gate region, or between the under-gate region and an under-drain region adjacent to the drain electrode in the first direction.

10. The field-effect transistor as set forth in claim 1, further comprising:
a gate electrode in contact with the gate insulating layer; wherein
the gate electrode, the gate insulating layer, the first semiconductor crystal layer, and the second semiconductor crystal layer are arranged in the order of the gate electrode, the gate insulating layer, the first semiconductor crystal layer, and the second semiconductor crystal layer in a first direction,
the gate electrode, the source electrode, and the drain electrode are arranged in the order of the source electrode, the gate electrode, and the drain electrode in a second direction perpendicular to the first direction,
the first semiconductor crystal layer and the second semiconductor crystal layer are formed in an under-gate region adjacent to the gate electrode in the first direction,
the second semiconductor crystal layer is formed in an under-source region adjacent to the source electrode in the first direction and in an under-drain region adjacent to the drain electrode in the first direction,
the second semiconductor crystal layer situated between the under-source region and the under-gate region and the second semiconductor crystal layer situated between the under-drain region and the under-gate region are doped with an impurity atom that is to generate as carrier, and
neither the first semiconductor crystal layer situated between the under-gate region and the source electrode or the under-source region nor the first semiconductor crystal layer situated between the under-gate region and the drain electrode or the under-drain region is doped with said impurity atom that is to generate said carrier.

11. The field-effect transistor as set forth in claim 1, further comprising
a base wafer supporting a stack structure including the gate insulating layer, the first semiconductor crystal layer, and the second semiconductor crystal layer, wherein
the base wafer is a wafer selected from the group consisting of a wafer made of single-crystal GaAs, a water made of single-crystal InP, a wafer made of single-crystal Si and a silicon-on-insulator (SOI) wafer.

12. A semiconductor wafer comprising:
a base wafer;
a second semiconductor crystal layer disposed directly or indirectly on the base wafer, the second semiconductor crystal being in contact with a source electrode and a drain electrode, and the source electrode and the drain electrode being in contact with only the second semiconductor crystal layer;
a first semiconductor crystal layer lattice-matching or pseudo lattice-matching the second semiconductor crystal layer; and
a third semiconductor crystal layer lattice-matching or pseudo lattice-matching the second semiconductor crystal layer, wherein the third semiconductor crystal layer is positioned between the first semiconductor crystal layer and the second semiconductor crystal layer,
wherein
the first semiconductor crystal layer is made of $\text{In}_{x1}\text{Ga}_{1-x1}\text{As}_{y1}\text{P}_{1-y1}$ ($0<x1<1$, $0<y1<1$),
the second semiconductor crystal layer is made of $\text{In}_{x2}\text{Ga}_{1-x2}\text{As}_{y2}\text{P}_{1-y2}$ ($0<x2<1$, $0<y2<1$, $y2 \neq y1$),
the third semiconductor crystal layer is made of $\text{Al}_{x3}\text{In}_{x4}\text{Ga}_{1-x3-x4}\text{As}_{y3}\text{P}_{1-y3}$ ($0<x3<1$, $0 \leq x4<1$, $0<x3+x4<1$, $0 \leq y3 \leq 1$),
the electron affinity $E_{a3}$ of the third semiconductor crystal layer is lower than the electron affinity $E_{a2}$ of the second semiconductor crystal layer, and
the electron affinity $E_{a1}$ of the first semiconductor crystal layer is lower than the electron affinity $E_{a2}$ of the second semiconductor crystal layer.

13. The semiconductor wafer as set forth in claim 12, wherein the second semiconductor crystal layer is made of $\text{In}_{x2}\text{Ga}_{1-x2}\text{As}_{y2}\text{P}_{1-y2}$ ($0 \leq x2 \leq 1$, $0 \leq y2 \leq 1$, $y2>y1$).

14. The semiconductor wafer as set forth in claim 13, wherein the As atom concentration of the first semiconductor crystal layer is 1% or lower.

15. The semiconductor wafer as set forth in claim 12, wherein at least part of the second semiconductor crystal layer contains an impurities that exhibits P-type conductivity.

16. The semiconductor wafer as set forth in claim 15, wherein the second semiconductor crystal layer includes a non-doped layer that is in contact with the first semiconductor crystal layer and free from the impurity, and a doped layer that is in contact with the non-doped layer and contains said impurity.

17. The semiconductor wafer as set forth in claim 16, wherein the non-doped layer has a thickness of 20 nm or less.

18. The semiconductor wafer as set forth in claim 12, further comprising
a fourth semiconductor crystal layer having P-type conductivity, wherein
the first semiconductor crystal layer, the second semiconductor crystal layer, and the fourth semiconductor crystal layer are arranged in the order of the first semiconductor crystal layer, the second semiconductor crystal layer, and the fourth semiconductor crystal layer,
the fourth semiconductor crystal layer lattice-matches or pseudo lattice-matches the second semiconductor crystal layer, and
the electron affinity $E_{a4}$ of the fourth semiconductor crystal layer is lower than the electron affinity $E_{a2}$ of the second semiconductor crystal layer.

19. The semiconductor wafer as set forth in claim 12, wherein the base wafer is a wafer selected from the group consisting of a wafer made of single-crystal GaAs, a wafer made of single-crystal InP, a wafer made of single-crystal Si and a silicon-on-insulator (SOI) wafer.

20. A method for producing a field-elect transistor, the method comprising:
forming an insulating layer in contact with the first semiconductor crystal layer of the semiconductor wafer as set forth in claim 12; and
forming an electrically conductive layer in contact with the insulating layer, the electrically conductive layer being to serve as a gate electrode of the field-effect transistor.

21. The method as set forth in claim 20 for producing a field-effect transistor, comprising:
prior to the formation or the insulating layer,
forming, directly or indirectly on the first semiconductor crystal layer, a mask covering a region in which the gate electrode is to be formed;
removing the first semiconductor crystal layer except for the region covered with the mask, by etching using the mask as a block film; and
doping a region of the second semiconductor crystal layer with an impurity atom by ion implantation using the mask as a block film, the first semiconductor crystal layer having been removed from the region of the second semiconductor crystal layer.

22. The method as set forth in claim 20 for producing a field-effect transistor, wherein the insulating layer is formed by an ALD or MOCVD method in an atmosphere containing a reducing material.

* * * * *